(12) United States Patent
Asao et al.

(10) Patent No.: US 8,542,519 B2
(45) Date of Patent: Sep. 24, 2013

(54) SEMICONDUCTOR MEMORY DEVICE

(75) Inventors: Yoshiaki Asao, Kawasaki (JP); Takeshi Kajiyama, Yokohama (JP); Kuniaki Sugiura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 288 days.

(21) Appl. No.: 13/035,168

(22) Filed: Feb. 25, 2011

(65) Prior Publication Data
US 2011/0215382 A1 Sep. 8, 2011

(30) Foreign Application Priority Data

Mar. 8, 2010 (JP) ................................ 2010-051015
Jul. 15, 2010 (JP) ................................ 2010-160972

(51) Int. Cl.
G11C 11/02 (2006.01)

(52) U.S. Cl.
USPC .............. 365/148; 257/295; 257/E29.323; 257/E21.663; 257/E21.665; 365/145; 365/158; 438/3

(58) Field of Classification Search
USPC ........... 257/295, E29.323, E21.663, E21.665; 365/145, 148, 158; 438/3
See application file for complete search history.

(56) References Cited

U.S. PATENT DOCUMENTS

| 6,584,011 | B2 * | 6/2003 | Watanabe | 365/158 |
| 7,548,450 | B2 * | 6/2009 | Aoki | 365/158 |
| 7,969,768 | B2 * | 6/2011 | Takizawa et al. | 365/158 |
| 2003/0103393 | A1 * | 6/2003 | Asao | 365/200 |
| 2004/0084702 | A1 * | 5/2004 | Jeong | 257/295 |
| 2006/0256611 | A1 * | 11/2006 | Bednorz et al. | 365/158 |
| 2006/0266470 | A1 * | 11/2006 | Koga | 156/272.4 |
| 2008/0035958 | A1 * | 2/2008 | Asao | 257/204 |
| 2008/0043514 | A1 * | 2/2008 | Ueda | 365/148 |
| 2008/0239796 | A1 * | 10/2008 | Aoki | 365/158 |
| 2009/0014703 | A1 | 1/2009 | Inaba | |
| 2010/0103718 | A1 | 4/2010 | Asao et al. | |
| 2010/0237321 | A1 | 9/2010 | Inaba | |

FOREIGN PATENT DOCUMENTS

JP 2008-192990 A 8/2008

OTHER PUBLICATIONS

M. Hosomi et al., "A Novel Nonvolatile Memory with Spin Torque Transfer Magnetization Switching: Spin-RAM," IEDM 2005, Technial Digest, pp. 473-476.
J.C. Slonczewski, "Current-driven excitation of magnetic multilayers," Journal of Magnetism and Magnetic Materials 159 (1996) L1-L7.
Background Art Information (Concise Explanation for JP 2008-192990 A), Feb. 17, 2010.

* cited by examiner

Primary Examiner — Allan R Wilson
(74) Attorney, Agent, or Firm — Knobbe, Martens, Olson & Bear LLP

(57) ABSTRACT

According to one embodiment, a semiconductor memory device is disclosed. The device includes MOSFET1 and MOSFET2 arranged in a first direction, variable resistive element (hereafter R1) above MOSFET1 and MOSFET2, a lower end of the R1 being connected to drains of MOSFET1 and MOSFET2, MOSFET3 and MOSFET4 arranged in the first direction, variable resistive element (hereafter R2) above MOSFET3 and MOSFET4, and a lower end of the R2 being connected to drains of MOSFET3 and MOSFET4. The device further includes first wiring line extending in the first direction and connected to sources of MOSFET1 and MOSFET2, second wiring line extending in the first direction and connected to sources of MOSFET3 and MOSFET4, upper electrode connecting upper end of the R1 and upper end of the R2, and third wiring line extending in the first direction and connected to the upper electrode.

11 Claims, 22 Drawing Sheets

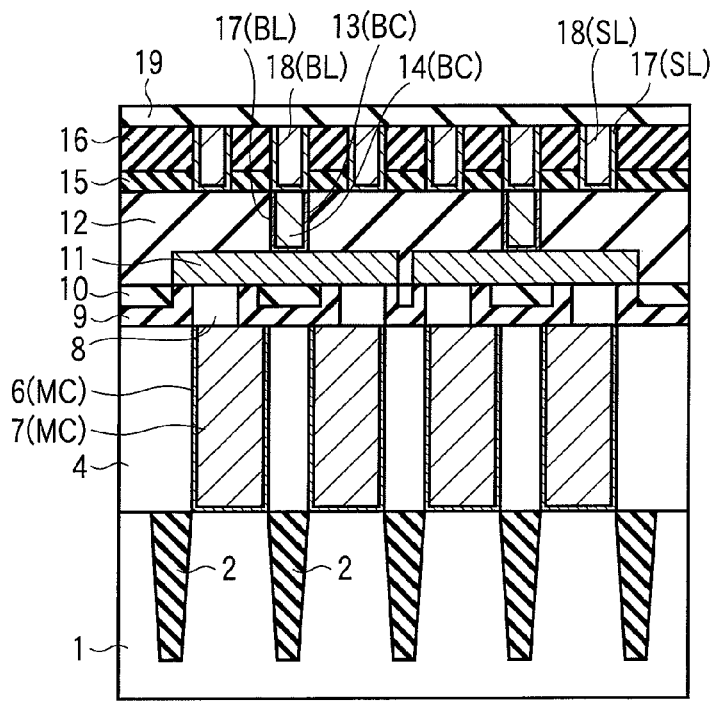
F I G. 3
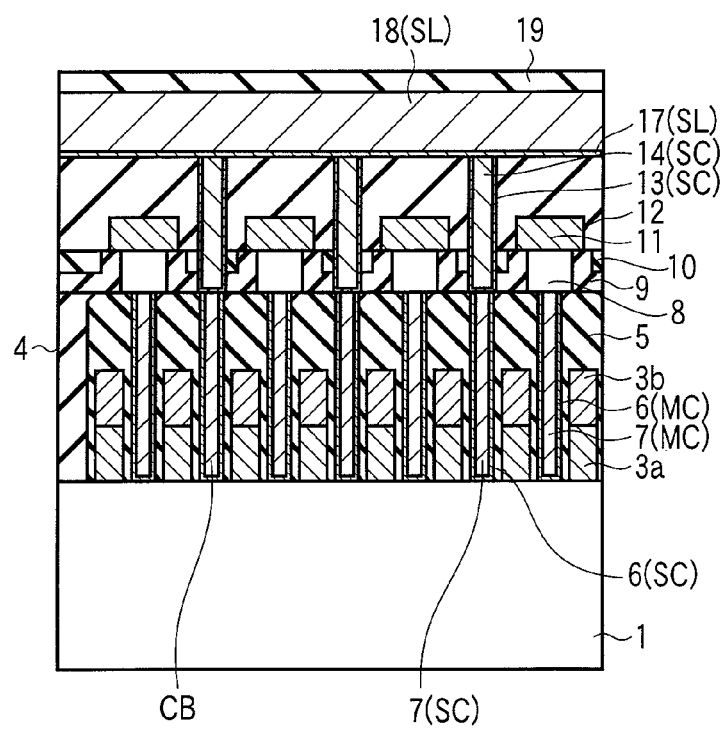
F I G. 4

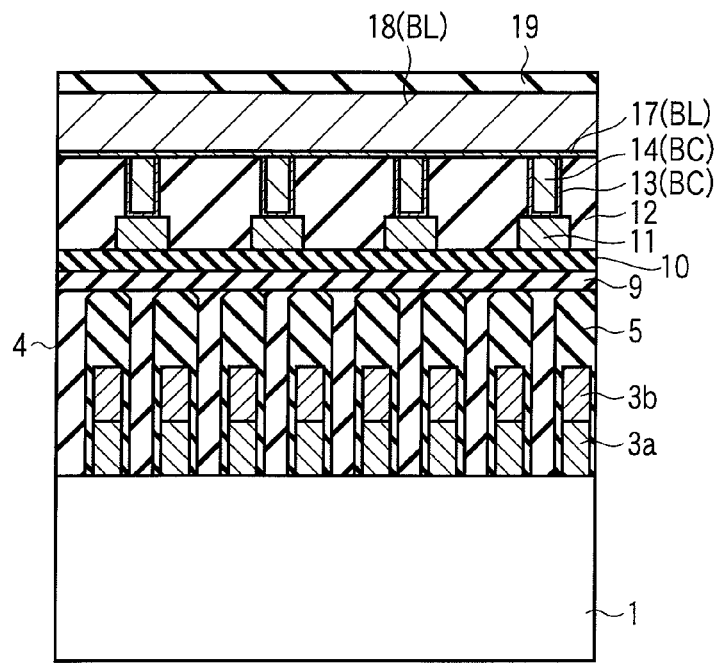
F I G. 5
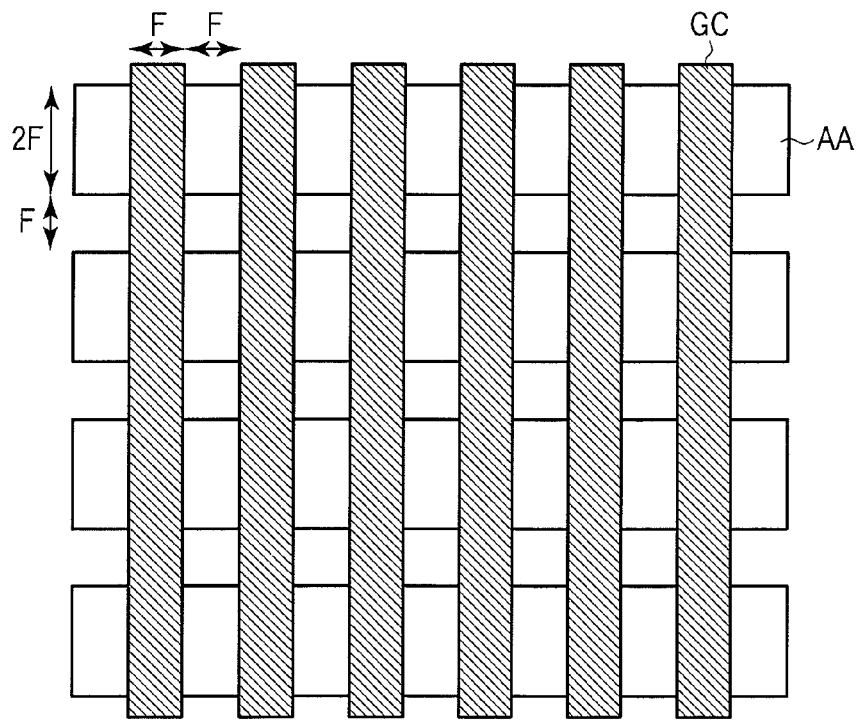
F I G. 6

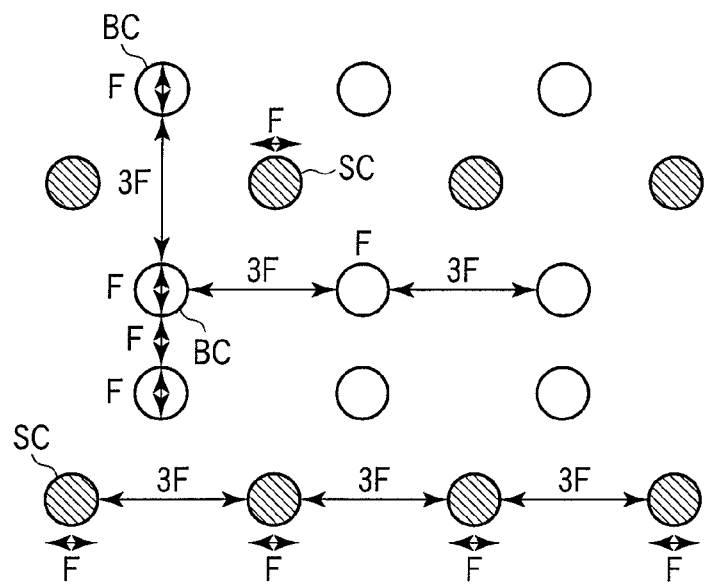
F I G. 9
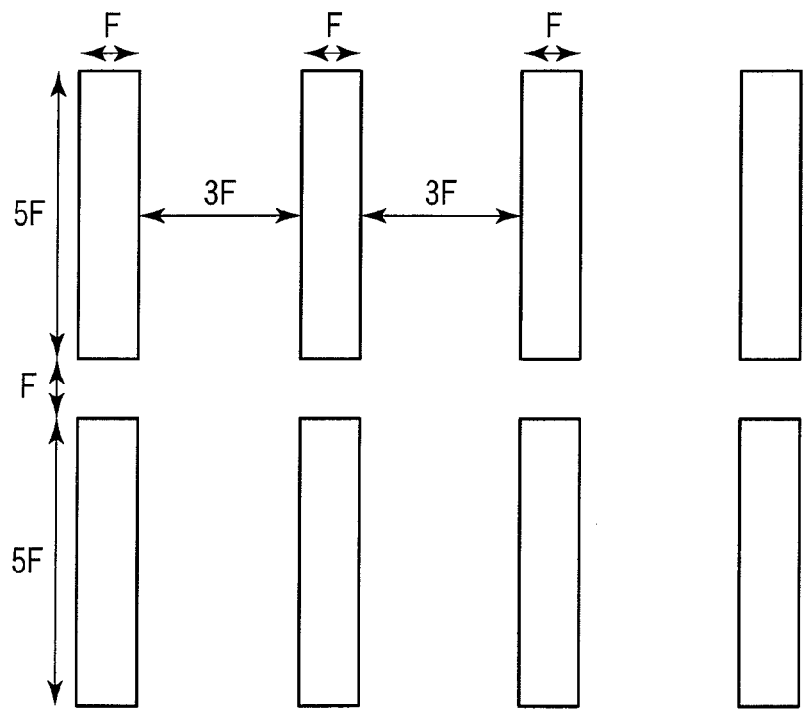
F I G. 10

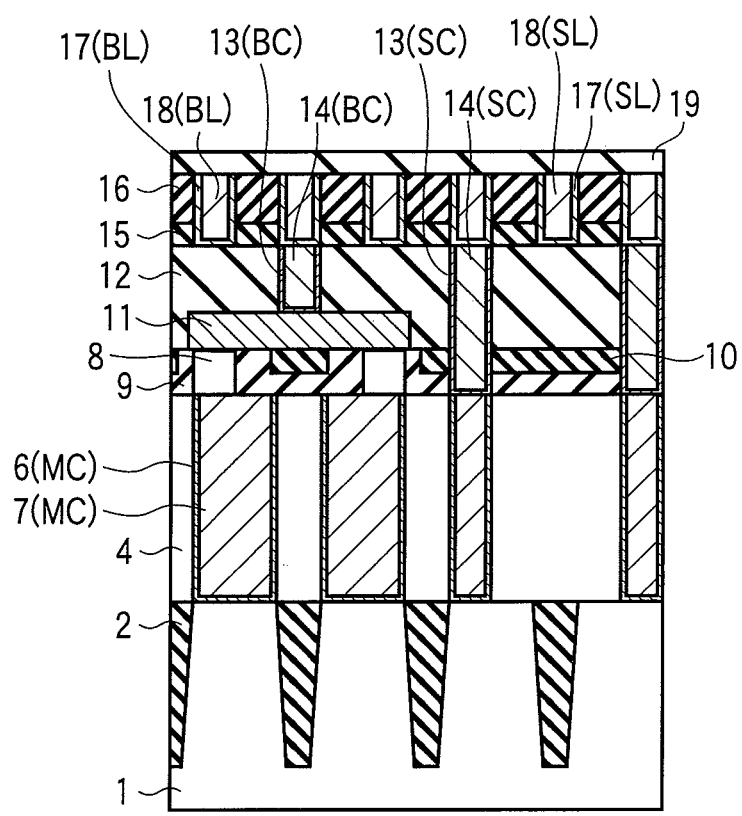
F I G. 14

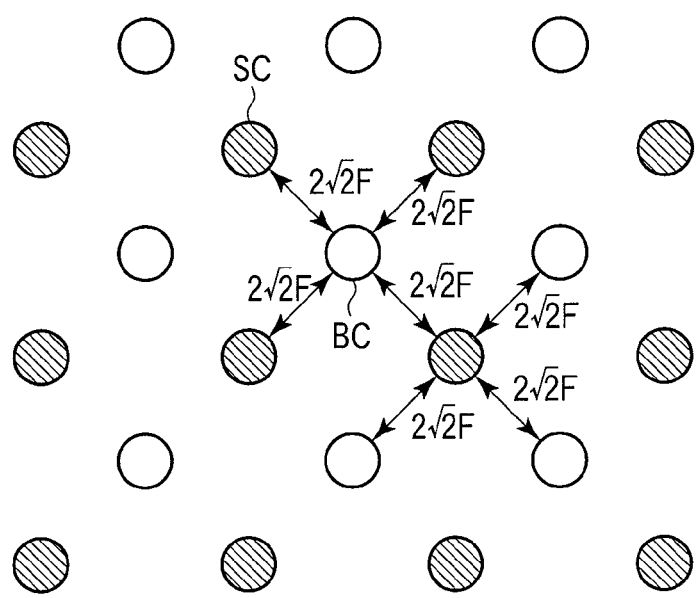
F I G. 17
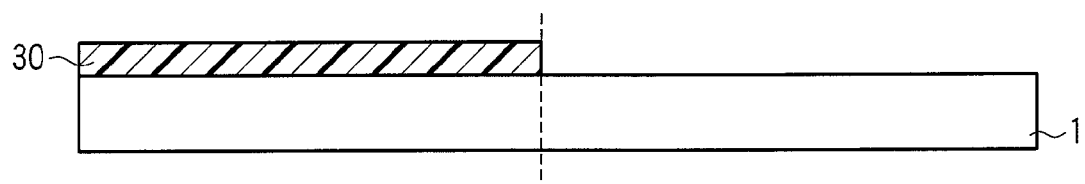
F I G. 18

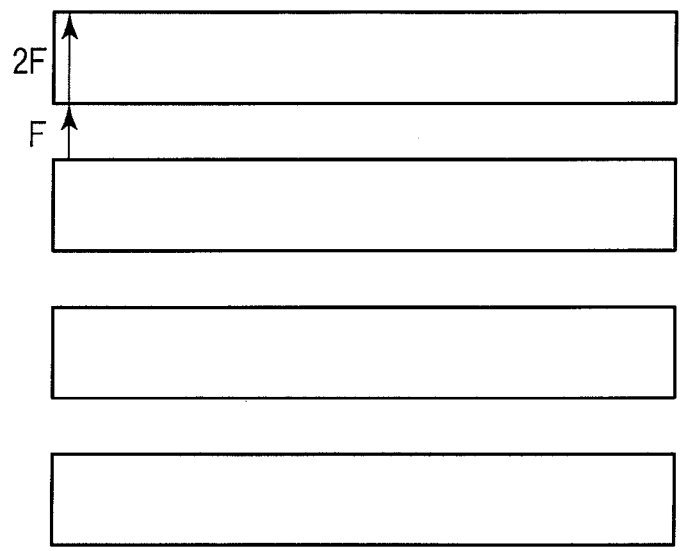
F I G. 19
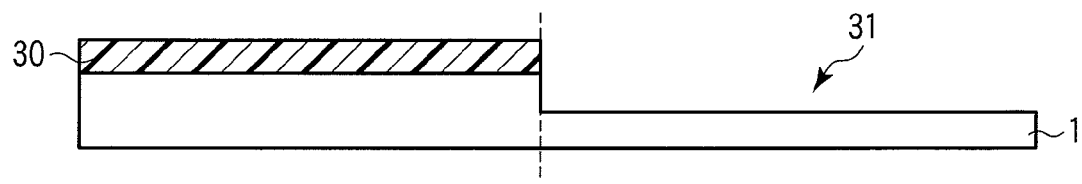
F I G. 20
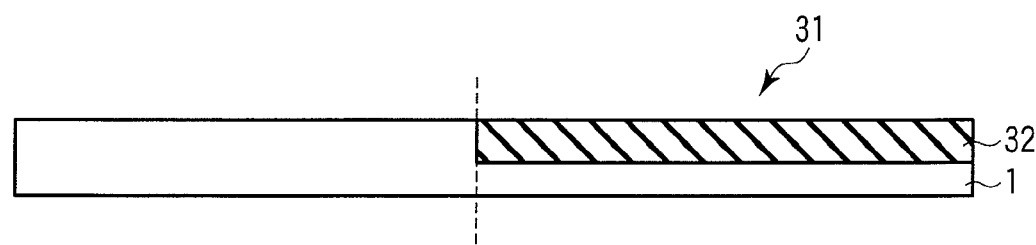
F I G. 21

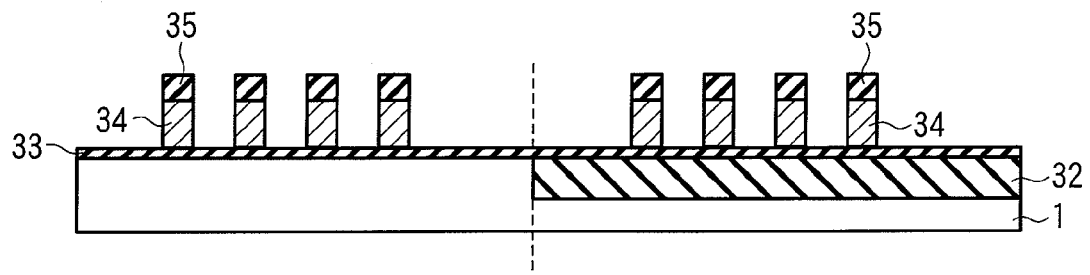
F I G. 22
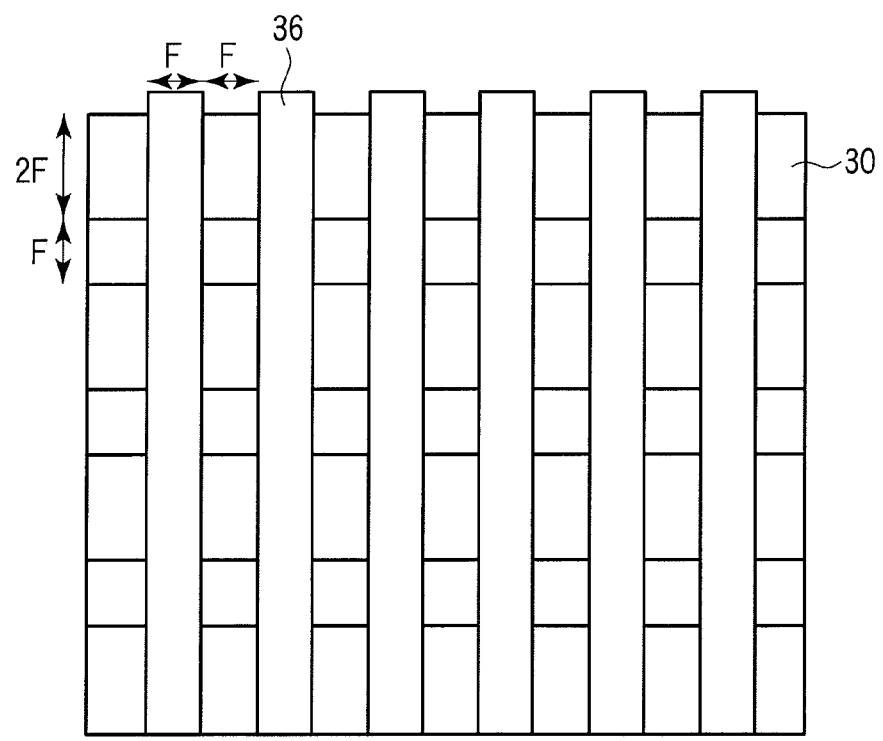
F I G. 23

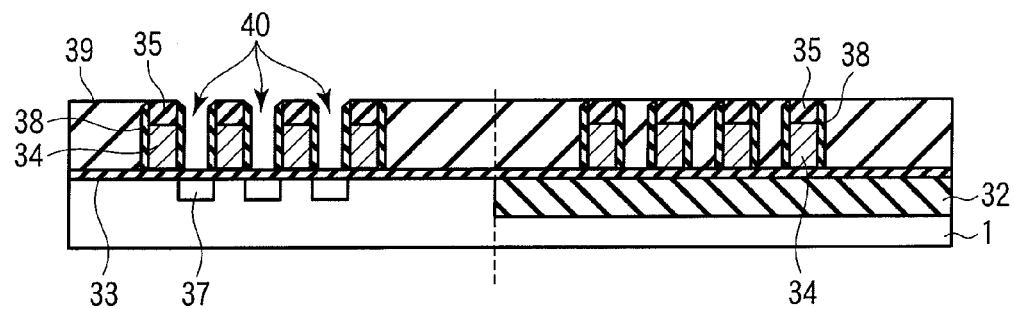
F I G. 27
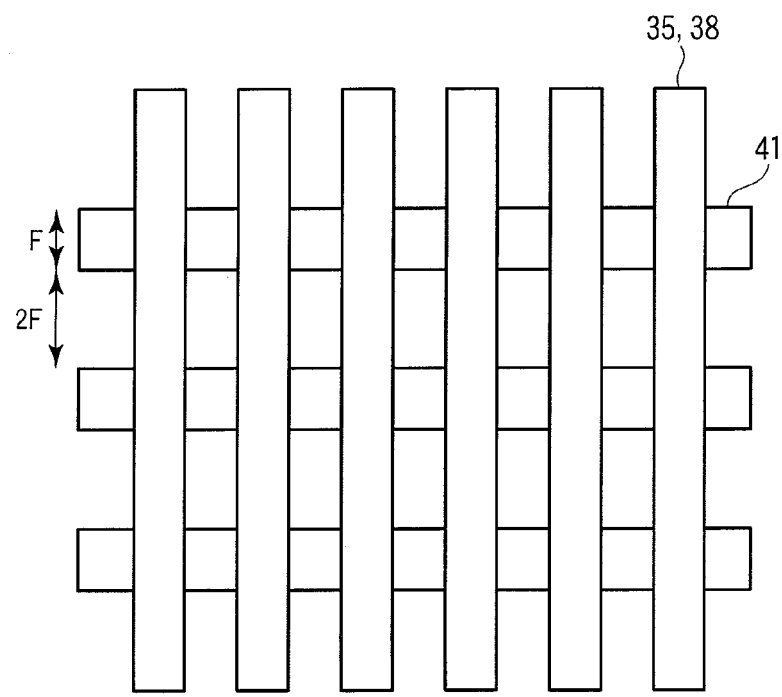
F I G. 28

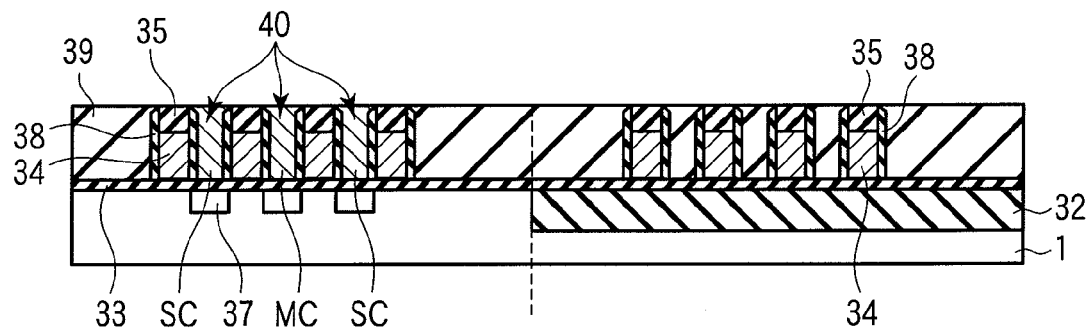
F I G. 29
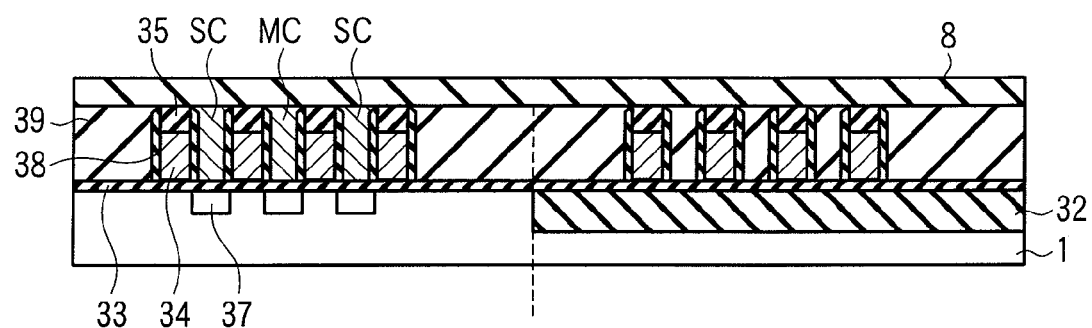
F I G. 30

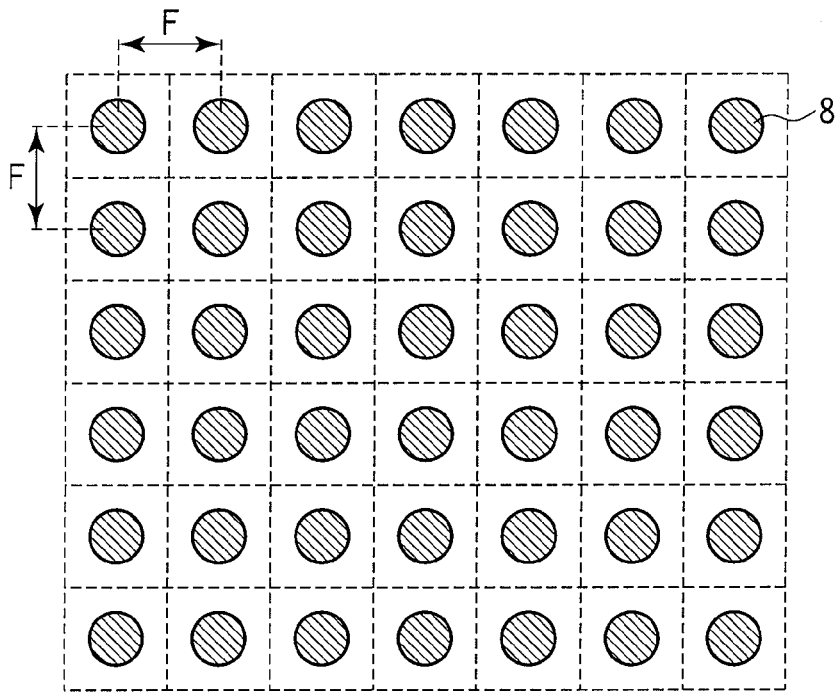
F I G. 31
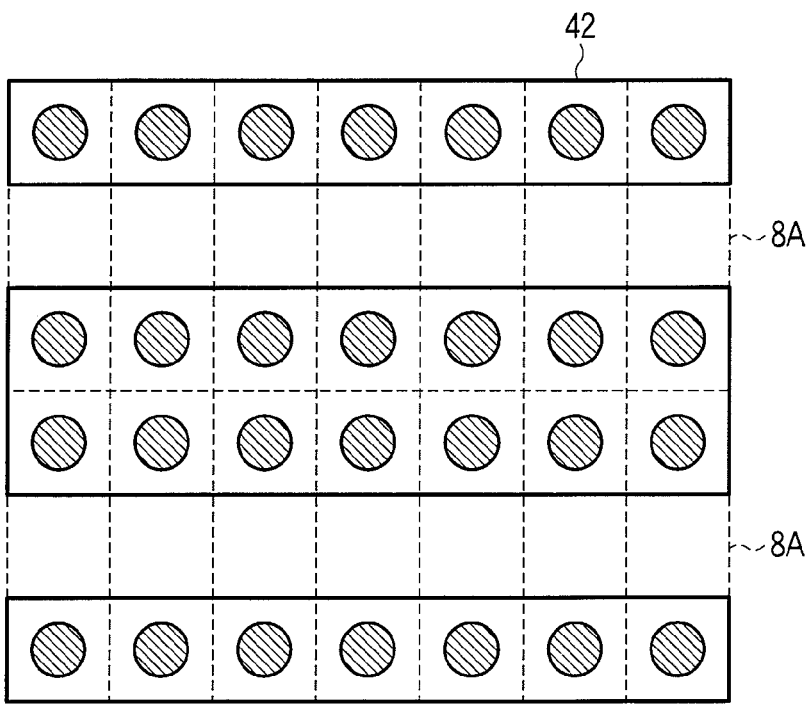
F I G. 32

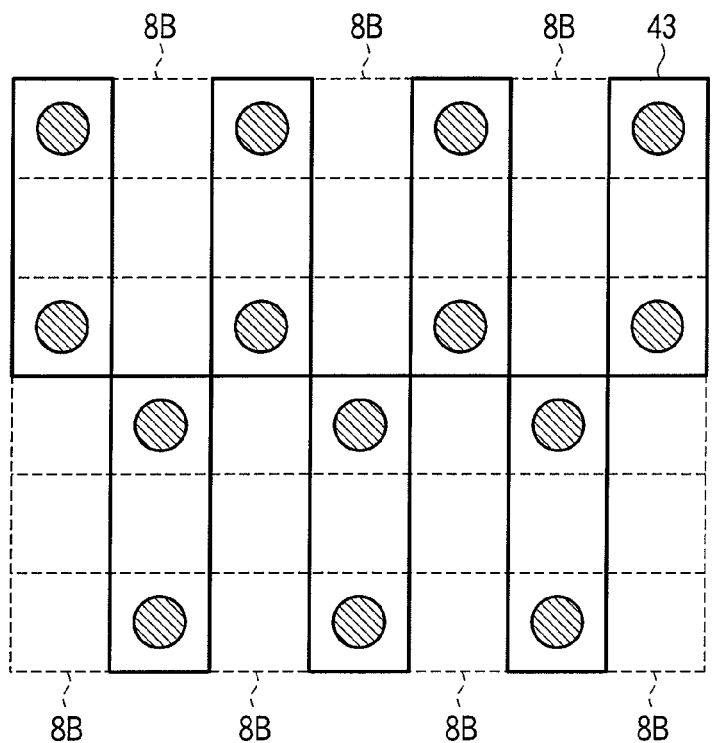
F I G. 33
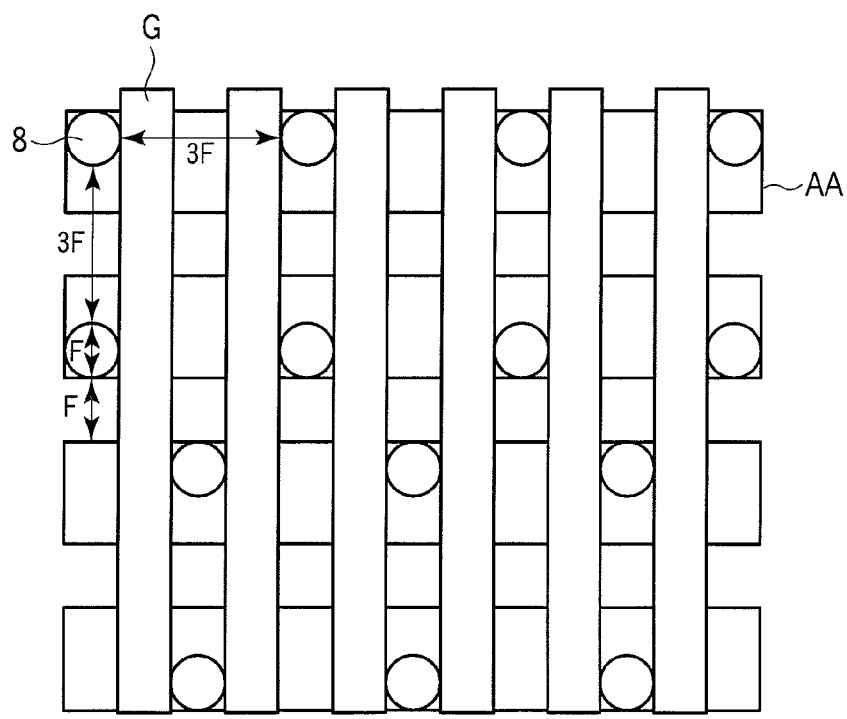
F I G. 34

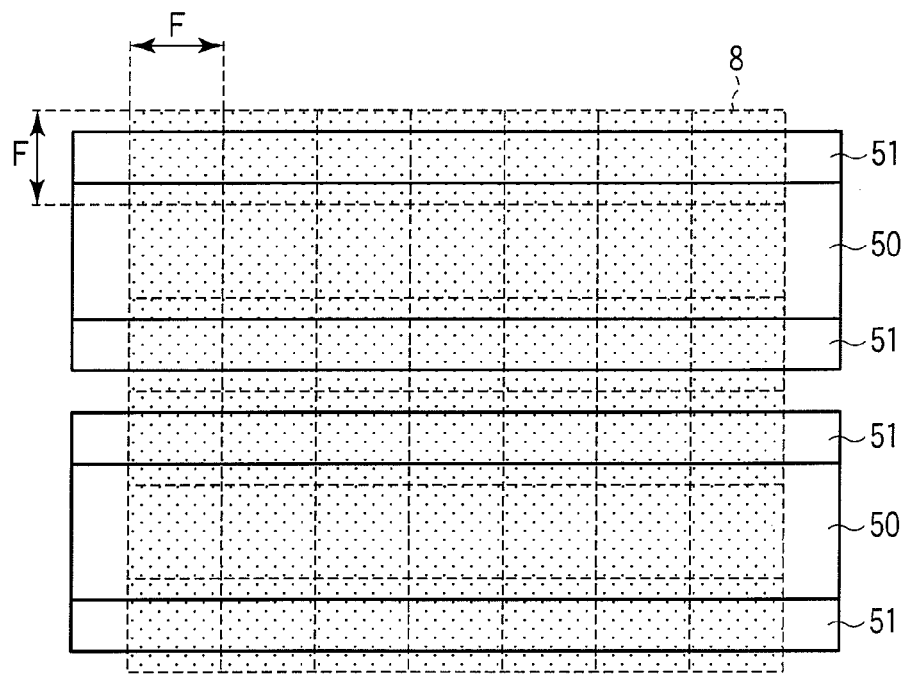
F I G. 35
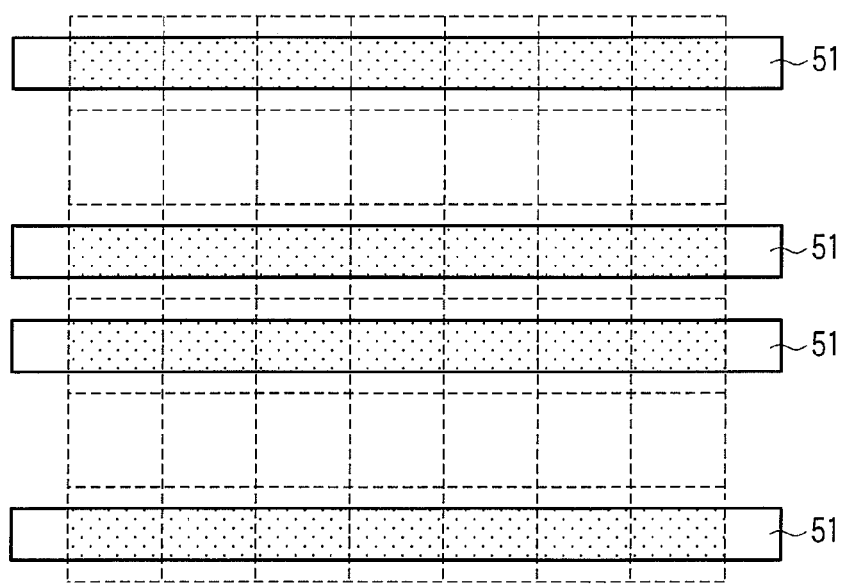
F I G. 36

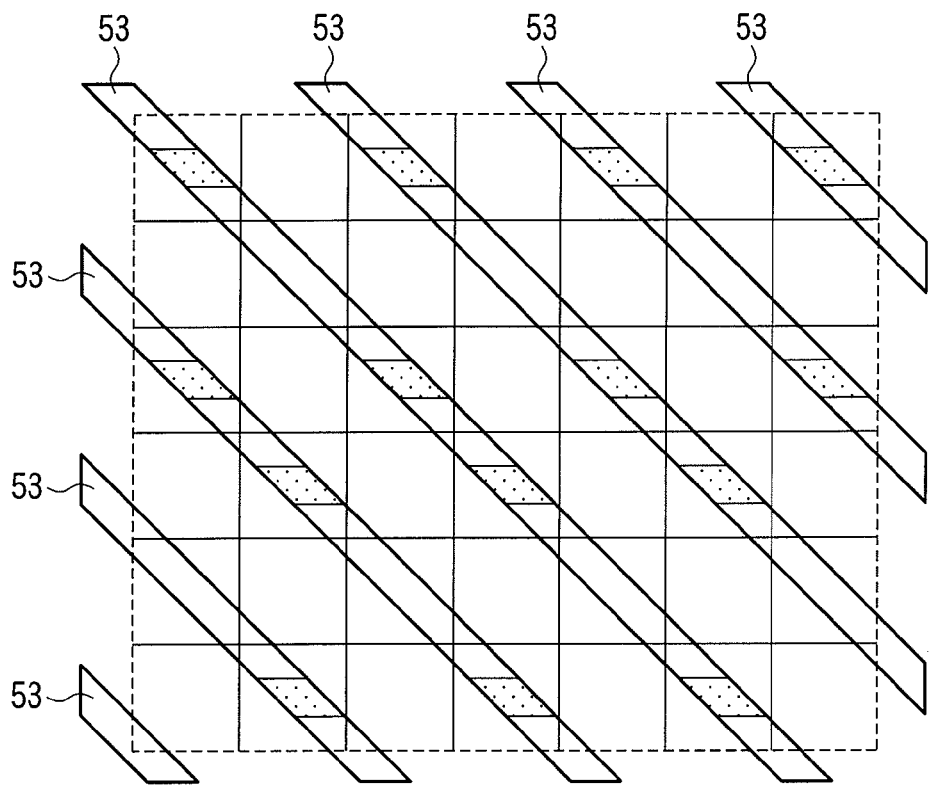
F I G. 38
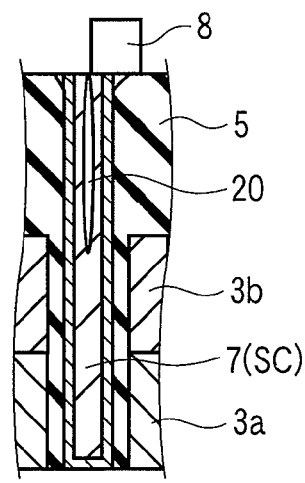
F I G. 39

SEMICONDUCTOR MEMORY DEVICE

CROSS-REFERENCE TO RELATED APPLICATIONS

This application is based upon and claims the benefit of priority from Japanese Patent Applications No. 2010-051015, filed Mar. 8, 2010; and No. 2010-160972, filed Jul. 15, 2010; the entire contents of both of which are incorporated herein by reference.

FIELD

Embodiments described herein relate generally to a semiconductor memory device using a variable resistive element for memory cell in which information is written to the memory cell by current passing through the variable resistive element.

BACKGROUND

In recent years, semiconductor memory utilizing a variable resistive element as a storage element, for example, phase-change random access memory (PRAM), magnetic random access memory (MRAM) and others have attracted attention and have been developed. The MRAM is a device which utilizes a magnetoresistive effect to store "1" or "0" information in memory cells, thereby performing a memory operation. The above device simultaneously has features of a non-volatility, a high-speed operation, a high integrity and a high reliability, and therefore it is positioned as one of candidates of memory devices which can be used in place of SRAM, pseudo SRAM (PSRAM), DRAM and the like.

There have been reported a large number of MRAM using element indicating a tunneling magnetoresistive (TMR) effect in the magnetoresistive effect. As the TMR effect element, a magnetic tunnel junction (MTJ) element is usually used, and the MTJ element has a laminated structure including two ferromagnetic layers and a nonmagnetic layer sandwiched between these layers, and utilizes the change of a magnetic resistance by spin polarization tunnel effect. The MTJ element can take a low resistance state and a high resistance state owing to the magnetization arrangement of the two ferromagnetic layers. The low resistance state is defined as "0", and the high resistance state is defined as "1", whereby one bit data can be recorded in the MTJ element.

When writing is made in the MRAM, for example, a writing current flows through the MTJ element to change the magnetization arrangement of the MTJ element from a parallel state to an anti-parallel state or from the anti-parallel state to the parallel state in accordance with the direction of this writing current. For example, a usual 1Tr+1MTJ type memory cell has a connecting constitution in which one end of the MTJ element is connected to a first bit line, the other end of the MTJ element is connected to one source/drain region of a selection transistor, and the other source/drain region of the selection transistor is connected to a second bit line.

The conventional MRAM having such a constitution comprises memory cells each including an MTJ and a MOS transistor (the selection transistor). To reduce a cell area, the source area of the MOS transistor in each of the memory cells is shared with another memory cell adjacent to the source area. A common source line is disposed in a layer below the bit line. The bit line and the common source line are formed in separate processes, respectively.

BRIEF DESCRIPTION OF THE DRAWINGS

FIG. 3 is a sectional view along arrows 3-3 of the plan view of FIG. 2;

FIG. 4 is a sectional view along arrows 4-4 of the plan view of FIG. 2;

FIG. 5 is a sectional view along arrows 5-5 of the plan view of FIG. 2;

FIG. 6 is a diagram showing a pattern layout of masks for forming active areas (AA) and gate conductors (GC) of the memory cell array of the second embodiment;

FIG. 9 is a diagram showing the pattern layout of masks for forming contacts (SC and BC) of the memory cell array of the second embodiment;

FIG. 10 is a diagram showing the pattern layout of masks for forming upper electrodes (UE) of the memory cell array of the second embodiment;

FIG. 14 is a sectional view along arrows 14-14 of the plan view of FIG. 13;

FIG. 17 is a diagram showing a pattern layout of masks for forming contacts (SC and BC) of the memory cell array of the third embodiment;

FIG. 18 is a sectional view for explaining a manufacturing method of a fourth embodiment;

FIG. 19 is a diagram showing a pattern layout of masks used in a process of FIG. 18;

FIG. 20 is a sectional view for explaining the manufacturing method of the fourth embodiment subsequently to FIG. 18;

FIG. 21 is a sectional view for explaining the manufacturing method of the fourth embodiment subsequently to FIG. 20;

FIG. 22 is a sectional view for explaining the manufacturing method of the fourth embodiment subsequently to FIG. 21;

FIG. 23 is a diagram showing the pattern layout of masks used in a process of FIG. 22;

FIG. 27 is a sectional view for explaining the manufacturing method of the fourth embodiment subsequently to FIG. 26;

FIG. 28 is a diagram showing the pattern layout of masks used in a process of FIG. 27;

FIG. 29 is a sectional view for explaining the manufacturing method of the fourth embodiment subsequently to FIG. 27;

FIG. 30 is a sectional view for explaining the manufacturing method of the fourth embodiment subsequently to FIG. 29;

FIG. 31 is a plan view for explaining the manufacturing method of the fourth embodiment subsequently to FIG. 30;

FIG. 32 is a plan view for explaining the manufacturing method of the fourth embodiment subsequently to FIG. 31;

FIG. 33 is a plan view for explaining the manufacturing method of the fourth embodiment subsequently to FIG. 32;

FIG. 34 is a diagram showing the pattern layout of MTJ elements obtained in a process of FIG. 33;

FIG. 35 is a plan view for explaining another forming method of the MTJ element in the manufacturing method of the fourth embodiment;

FIG. 36 is a plan view for explaining the other forming method of the MTJ element in the manufacturing method of the embodiment subsequently to FIG. 35;

FIG. 38 is a plan view for explaining the other forming method of the MTJ element in the manufacturing method of the embodiment subsequently to FIG. 37; and FIG. 39 is a sectional view for explaining the fourth embodiment.

DETAILED DESCRIPTION

Embodiments will be described with reference to the drawings.

First Embodiment

In general, according to one embodiment, a semiconductor memory device includes MOSFET1 and MOSFET2 arranged in a first direction; variable resistive element (hereafter R1) above MOSFET1 and MOSFET2, a lower end of the R1 being connected to drains of MOSFET1 and MOSFET2; MOSFET3 and MOSFET4 arranged in the first direction; variable resistive element (hereafter R2) above MOSFET3 and MOSFET4, and a lower end of the R2 being connected to drains of MOSFET3 and MOSFET4. The device further includes first wiring line extending in the first direction and connected to sources of MOSFET1 and MOSFET2; second wiring line extending in the first direction and connected to sources of MOSFET3 and MOSFET4; upper electrode connecting upper end of the R1 and upper end of the R2; and third wiring line extending in the first direction and connected to the upper electrode.

Second Embodiment

As a variable resistive type memory, it is possible to use one of various types of memories such as a magnetic random access memory (MRAM), a resistance random access memory (ReRAM) and a phase-change random access memory (PRAM). In the present embodiment, the MRAM will be described as one example of the variable resistive type memory. The MRAM comprises, as storage elements, magnetic tunnel junction (MTJ) elements utilizing a tunneling magnetoresistive (TMR) effect, and information is stored in accordance with the magnetization state of this MTJ element.

Figure 1:
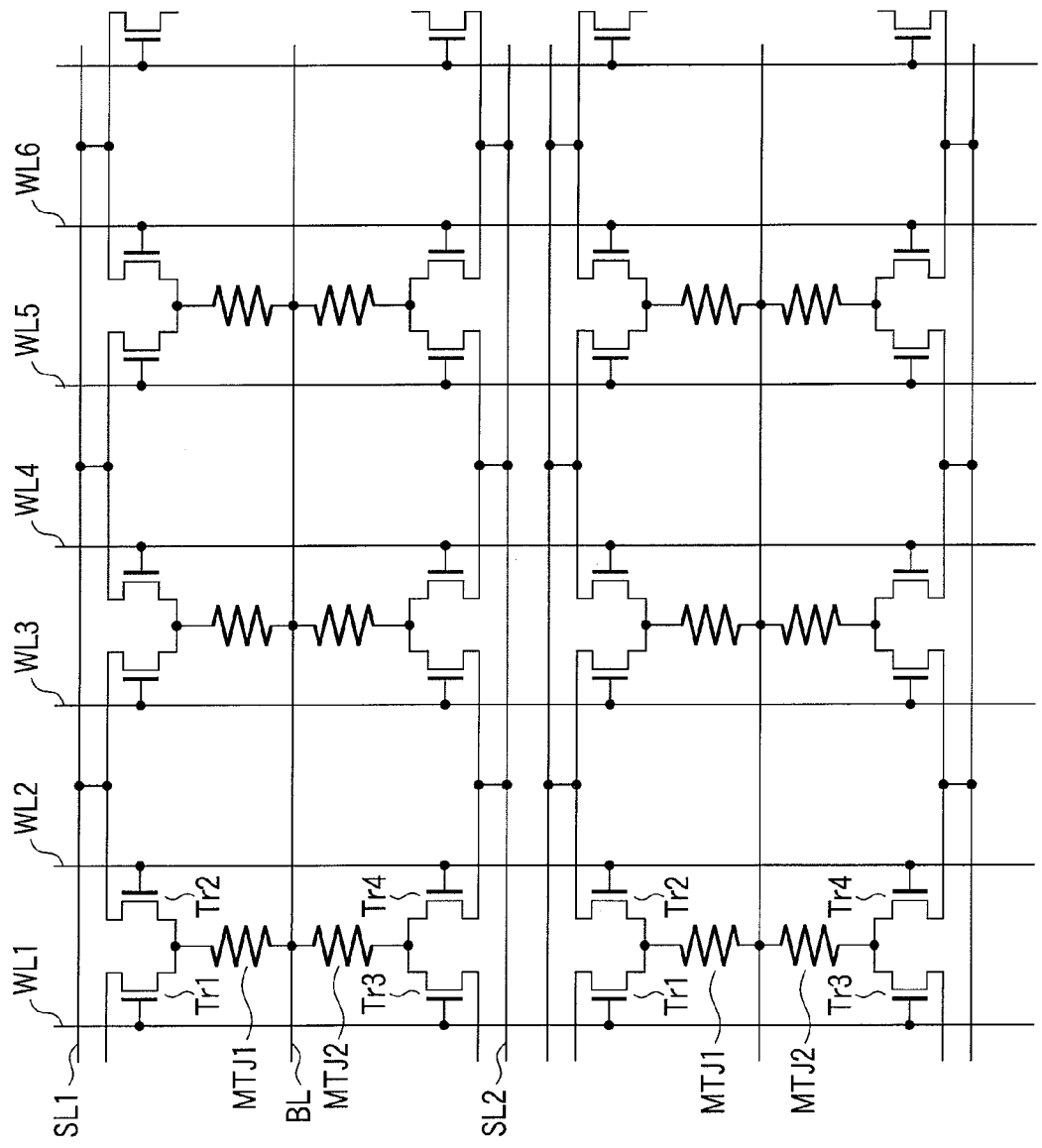
FIG. 1 is an equivalent circuit diagram showing a memory cell array of a second embodiment.

FIG. 1 is an equivalent circuit diagram showing a memory cell array of a semiconductor memory device of the second embodiment.

The memory cell array comprises a plurality of MRAM cells (memory cells), word lines extending in a first direction, and bit lines and source lines extending in a second direction which is perpendicular to the first direction. Each of the MRAM cells comprises the MTJ element as a variable resistive element, and a MOS transistor which is a selection element for selecting the MTJ element. The MTJ element has a structure in which a fixed layer (magnetic pinned layer), a tunnel barrier layer and a recording layer (magnetic free layer) are successively laminated.

In FIG. 1, for the sake of simplicity, the MTJ elements, the MOS transistors, the word lines, the bit lines and the source lines are only partially denoted with reference symbols.

In FIG. 1, MTJ1 and MTJ2 are MTJ elements (first and second magnetic resistance elements), Tr1 to Tr4 are MOS transistors (first to fourth MOSFETs), WL1 to WL6 are word lines, SL1 and SL2 are source lines (first and second wiring lines), and BL is a bit line (a third wiring line).

In the present embodiment, one MRAM cell comprises one MTJ element and two MOS transistors (2T1MTJ type MRAM).

Hereinafter, the MRAM cells of the present embodiment will further be described by using the elements denoted with the reference symbols.

A gate (a gate conductor) of the first MOS transistor Tr1 is connected to the word line WL1. A gate (a gate conductor) of the second MOS transistor Tr2 is connected to the word line WL2 disposed adjacent to the word line WL1 in a lateral direction (the first direction).

A source of the first MOS transistor Tr1 and a source of the second MOS transistor Tr2 are both connected to the source line SL1.

A drain of the first MOS transistor Tr1 and a drain of the second MOS transistor Tr2 share a diffusion layer (a common drain), and are connected to one end of the MTJ element MTJ1 (the lower end in the sectional view showing a device structure). The other end of the MTJ element MTJ1 (the upper end in the sectional view showing the device structure) is connected to the bit line BL disposed adjacent to the source line SL1 via an upper electrode (not shown).

The first MOS transistor Tr1, the second MOS transistor Tr2 and the MTJ element MTJ1 constitute one MRAM cell (a first memory cell), and voltages applied to the word, bit and source lines are controlled to perform writing and reading.

Similarly, a source of the third MOS transistor Tr3 and a source of the fourth MOS transistor Tr4 are both connected to the source line SL2. The source line SL2 is formed adjacent to the bit line on a side opposite to the source line SL1 disposed adjacent to the bit line. The third and fourth MOS transistors Tr3 and Tr4 are connected to the word lines WL1 and WL2, and a drain (a common drain) of the third and fourth MOS transistors Tr3 and Tr4 is connected to one end of the MTJ element MTJ2 (the lower end in the sectional view showing the device structure). The other end of the MTJ element MTJ2 (the upper end in the sectional view showing the device structure) is connected to the bit line BL via the upper electrode (not shown).

The transistors Tr1 to Tr4 and the MTJ elements MTJ1 and MTJ2 constitute two memory cells (a cell unit). Under this cell unit (in the arrangement direction of the bit lines), a cell unit having the same constitution is disposed. The cell units having the same constitution are also interposed between the word line WL3 and the word line WL4 and between the word line WL5 and the word line WL6.

Figure 2:
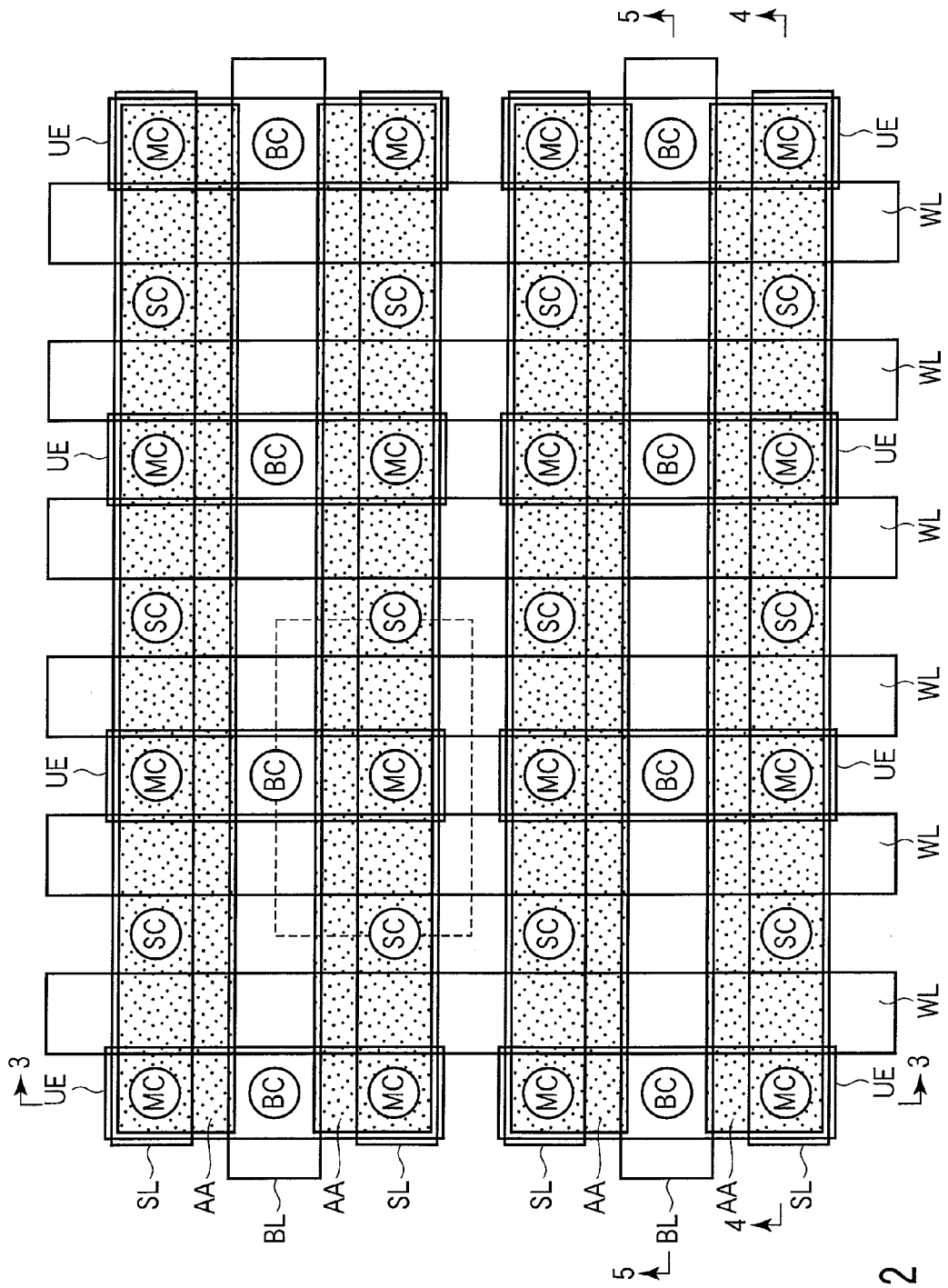
FIG. 2 is a plan view showing the memory cell array of the second embodiment.

FIG. 2 is a plan view showing the memory cell array of the present embodiment.

In FIG. 2, UE is an upper electrode for connecting recording layers of two MTJ elements (e.g., MTJ1 and MTJ2 of FIG. 1) disposed adjacent to each other in the second direction (the arrangement direction of the bit lines), AA is an active area, MC is a contact between the MTJ element and the drain of the MOS transistor, SC is a contact between the source line and the source of the MOS transistor, and BC is a contact between the bit line and the upper electrode.

Moreover, a rectangular area surrounded by a broken line is an area for one cell, and has a size of 3F×4F (F is a minimum processing dimension)=12F2. Moreover, the active area AA has a width of 2F (the dimension along the second direction in FIG. 2), and an area sandwiched between two adjacent active areas AA (an isolation area) has a width of F.

As shown in FIG. 2, the centers of the contacts MC and SC shift from the center of the area AA in the width direction (the second direction), along the second direction. In the plan view, the contacts MC and SC are positioned in a half area of the area AA on one side thereof in the width direction so that the contacts are disposed away from the bit line and the contact BC. Therefore, the center of the contact MC shifts as much as 2F from the center of the contact BC in the second direction. Moreover, the center of the contact MC shifts as much as 2F from the center of the contact SC in the first direction. In consequence, a length between the center of the contact BC and the center of the contact SC is $2\sqrt{2}F$.

FIG. 3 is a sectional view along arrows 3-3 of the plan view of FIG. 2, FIG. 4 is a sectional view along arrows 4-4 of the plan view of FIG. 2, and FIG. 5 is a sectional view along arrows 5-5 of the plan view of FIG. 2. In FIG. 3 to FIG. 5, a part corresponding to FIG. 2 is denoted with the same symbols as those of FIG. 2. It is to be noted that in FIG. 3 to FIG. 5, a gate insulating film, a source area and a drain area constituting the MOS transistor are omitted.

The contact MC comprises a barrier metal film 6 and a plug 7. The barrier metal film 6 is disposed on the side and bottom surfaces of the plug 7. The barrier metal film 6 and the plug 7 are formed by damascene process. The material of the plug 7 is, for example, tungsten. The barrier metal film 6 is, for example, a TiN film, a Ti film or a laminated film of these films.

The contact BC comprises a barrier metal film 13 and a plug 14. The barrier metal film 13 is disposed on the side and bottom surfaces of the plug 14. The barrier metal film 13 and the plug 14 are formed by the damascene process. The material of the plug 14 is, for example, copper, and the barrier metal film 13 is, for example, a laminated film of Ti/TiN.

The contact SC comprises a barrier metal film 6, a plug 7, a barrier metal film 13 and a plug 14. The barrier metal film 6 and the plug 7 constituting the contact SC are formed by the same damascene process as that for forming the barrier metal film 6 and the plug 7 constituting the contact MC. Moreover, the barrier metal film 13 and the plug 14 constituting the contact SC are formed by the same damascene process as that for forming the barrier metal film 13 and the plug 14 constituting the contact BC.

The bit line BL comprises a barrier metal film 17 and a wiring line 18. The barrier metal film 17 is disposed on the side and bottom surfaces of the wiring line 18. The barrier metal film 17 and the wiring line 18 are formed by the damascene process. The material of the wiring line 18 is, for example, copper, and the barrier metal film 17 is, for example, a laminated film of Ti/TiN.

The source line SL comprises a barrier metal film 17 and a wiring line 18. The barrier metal film 17 and the wiring line 18 constituting the bit line BL are formed by the damascene process. The source line SL is formed in the same layer as that of the bit line BL (the layer in which insulating films 15 and 16 are formed). The source line SL and the bit line BL are formed of the same material. That is, the bit line BL and the source line SL are formed by the same damascene process using the same photolithography. The bit line BL and the source line SL can be formed without using any self alignment process.

On the other hand, in a conventional case, a bit line and a common source line are formed in two different layers. Therefore, a bit line BL and a source line SL are formed by different damascene processes using different photolithography processes, respectively.

The bit line is disposed above the common source line, and hence a connection hole for the contact BC has a high aspect ratio. The connection hole for the contact BC needs to be formed in an area between two source lines SL having a width decreased owing to miniaturization. However, it is difficult to form the connection hole in the above small area from the viewpoint of the accuracy of lithography process.

To form the connection hole for the contact BC in the area having the small width between the two source lines SL irrespective of the accuracy of the lithography process, the self alignment process needs to be introduced.

However, it is difficult to perform the self alignment process owing to the following reason. That is, an insulating films as a etching stopper (e.g., silicon nitride film) need to be formed in the side walls and upper portion of the source line so that the source line is not etched during etching for forming the connection hole, which is difficult. That is, the damascene process is not suited for the self alignment process as described above.

On the other hand, a process using RIE (the RIE process) is suited for the self alignment process, as compared with the damascene process. In the RIE process, Al or W is used as a wiring material. Al or W has a high sheet resistance as compared with Cu (the wiring material used in the damascene process). Consequently, the RIE process using Al or W is suited for the self alignment process, but is not suited for memories after 30 nm generation.

Therefore, according to the present embodiment, the number of processes necessary for forming the bit and source lines can be decreased as compared with the conventional example, whereby cost increase can be suppressed. Moreover, according to the present embodiment, the bit and source lines can be formed without using the technically difficult self alignment process. Therefore, even when the miniaturization advances, the processes of the present embodiment are advantageous. For example, in the memories after the 30 nm generation using a low-sheet-resistance wiring material such as Cu, the processes of the present embodiment are advantageous.

Moreover, in the present embodiment, as shown in FIG. 2, the length between the center of the contact BC and the center of the contact SC is $2\sqrt{2}F$.

Therefore, according to the present embodiment, the length between the contact BC and the contact SC can sufficiently be increased, and hence the processes of the present embodiment are advantageous. That is, the memory cell array of the present embodiment has a constitution which can easily be realized, even when the miniaturization (integration) advances.

It is to be noted that the bit lines BL (17 and 18) and the contacts BC (13 and 14) may be formed by dual damascene process. Similarly, the source lines SL (17 and 18) and the contacts SC (13 and 14) may be formed by dual damascene process.

Also in this case, the bit lines BL (17 and 18), the contacts BC (13 and 14), the source lines SL (17 and 18) and the contacts SC (13 and 14) can be formed by the same dual damascene process, and hence the number of the processes can be decreased.

It is to be noted that in FIG. 3 to FIG. 5, 1 is a silicon substrate; 2 is an isolation area (shallow trench isolation (STI)); 3a is a gate electrode (a gate conductor) made of polycrystalline silicon; 3b is a gate electrode (the word line (the gate conductor) made of a metal (e.g., W); 4 is an interlayer insulating film (e.g., a silicon oxide film); 5 is an insulating film (e.g., a silicon nitride film) which covers the upper portion and side walls of the gate electrode; 8 is an MTJ element (having a width of F) formed on the plug 7; 9 is an insulating film (e.g., a silicon nitride film) as a protective film which covers the side surfaces of the MTJ element 8; 10 is an interlayer insulating film (e.g., a silicon nitride film) formed in a layer in which the MTJ element 8 and the insulating film 9 are formed; 11 is an upper electrode (corresponding to UE of FIG. 2); 12 is an interlayer insulating film (e.g., a silicon oxide film) formed in a layer in which the upper electrode 11 is formed; 15 and 16 are interlayer insulating films in which the bit line BL and the source line SL are embedded (e.g., 15 is a silicon nitride film and 16 is a silicon oxide film); and 19 is an insulating film (e.g., a silicon nitride film) formed to cover the upper surfaces of the bit line BL and the source line SL and having a function of preventing a diffusion layer of Cu.

A method of forming the MTJ elements 8 will briefly be described.

Films of three layers having a thickness of about 100 nm and constituting the MTJ element 8 (a fixed layer, a tunnel barrier layer and a recording layer) are formed by sputtering process. By the photolithography process and an etching process, the above three-layer films are patterned to form the MTJ element 8.

The fixed layer and the recording layer are, for example, magnetic metal layers made of iron or the like. The magnetic metal layers may contain a nonmagnetic metal such as tantalum or ruthenium. The tunnel barrier layer is, for example, a magnesium oxide (MgO) layer.

Next, the silicon nitride film having a thickness of about 20 nm and constituting the insulating film 9 is formed by plasma chemical vapor deposition (CVD) process.

Next, an insulating film (an HDP insulating film) is formed as the interlayer insulating film 10 on the above silicon nitride film by HDP process.

Next, the above HDP insulating film and the above silicon oxide film are polished by chemical mechanical polishing (CMP) process so that the surface (the recording layer) of the MTJ element 8 is exposed.

Next, a TiN film having a thickness of about 50 nm and constituting the upper electrode 11 is formed. By photolithography process and the etching process, the above TiN film is patterned to form the upper electrode 11.

FIG. 6 to FIG. 11 show the layouts of photo masks for forming the memory cell array of the present embodiment.

FIG. 6 shows the pattern layout of masks for forming active areas (AA) and gate conductors (GC) of the present embodiment.

Figure 7:
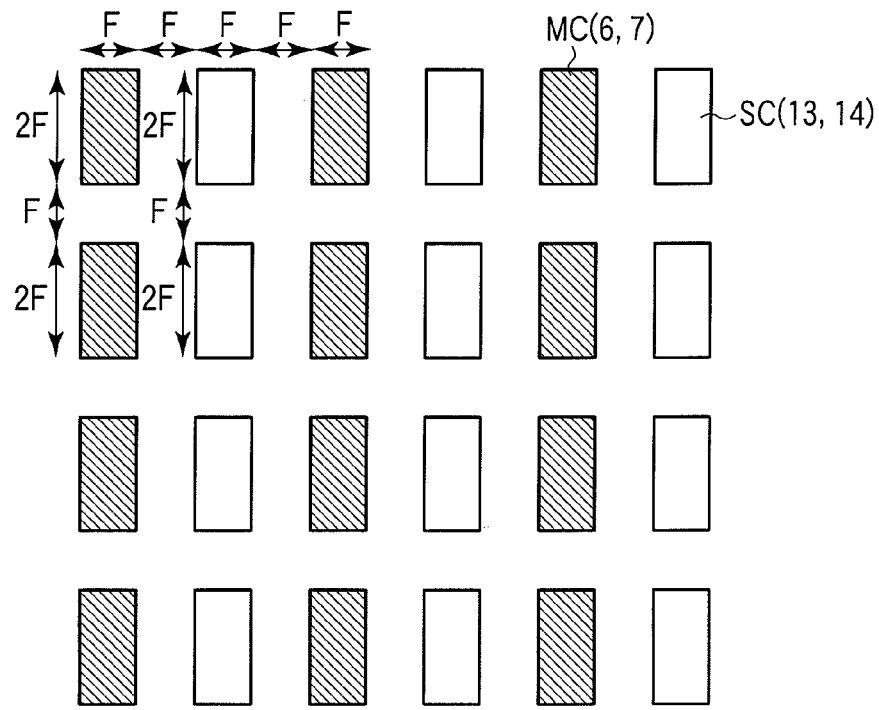
FIG. 7 is a diagram showing the pattern layout of masks for forming contacts (MC) of the memory cell array of the second embodiment.

FIG. 7 shows the pattern layout of masks for forming the contacts MC (6 and 7) and the contacts SC (13 and 14) of the present embodiment.

Figure 8:
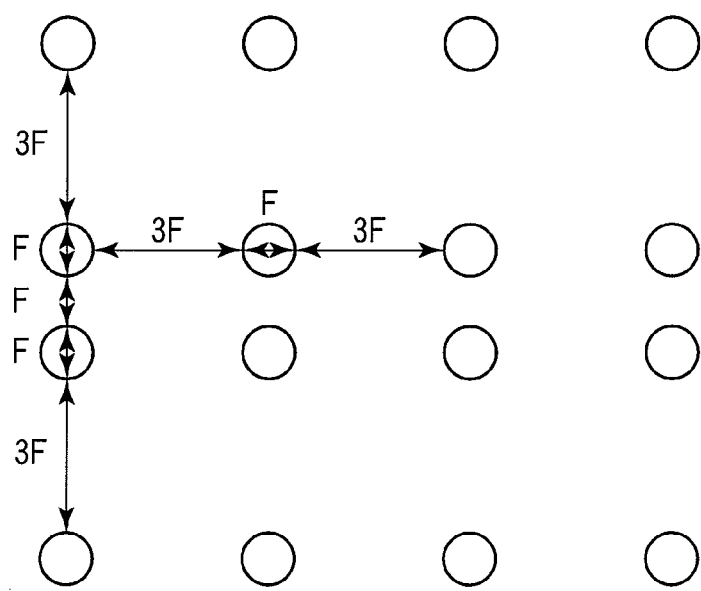
FIG. 8 is a diagram showing the pattern layout of masks for forming an MTJ element of the memory cell array of the second embodiment.

FIG. 8 shows the pattern layout of masks for forming the MTJ elements of the present embodiment.

FIG. 9 shows the pattern layout of masks for forming the contacts SC and the contacts BC of the present embodiment.

FIG. 10 shows the pattern layout of masks for forming the upper electrodes (UE) of the present embodiment.

Figure 11:
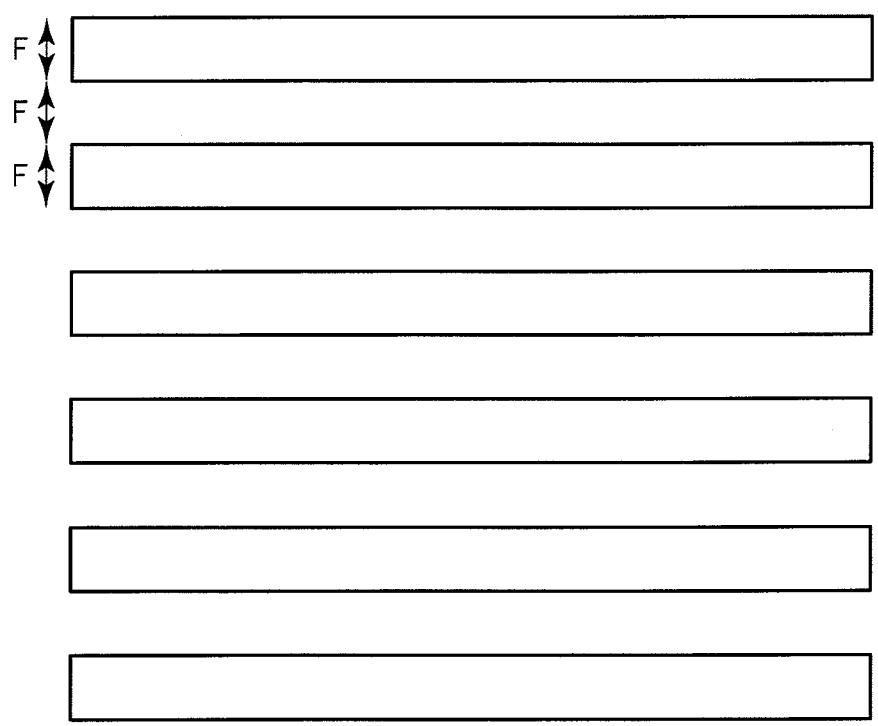
FIG. 11 is a diagram showing the pattern layout of masks for forming isolation areas (STI) of the memory cell array of the second embodiment.

FIG. 11 shows the pattern layout of masks for forming the isolation areas (STI) of the present embodiment.

Third Embodiment

Figure 12:
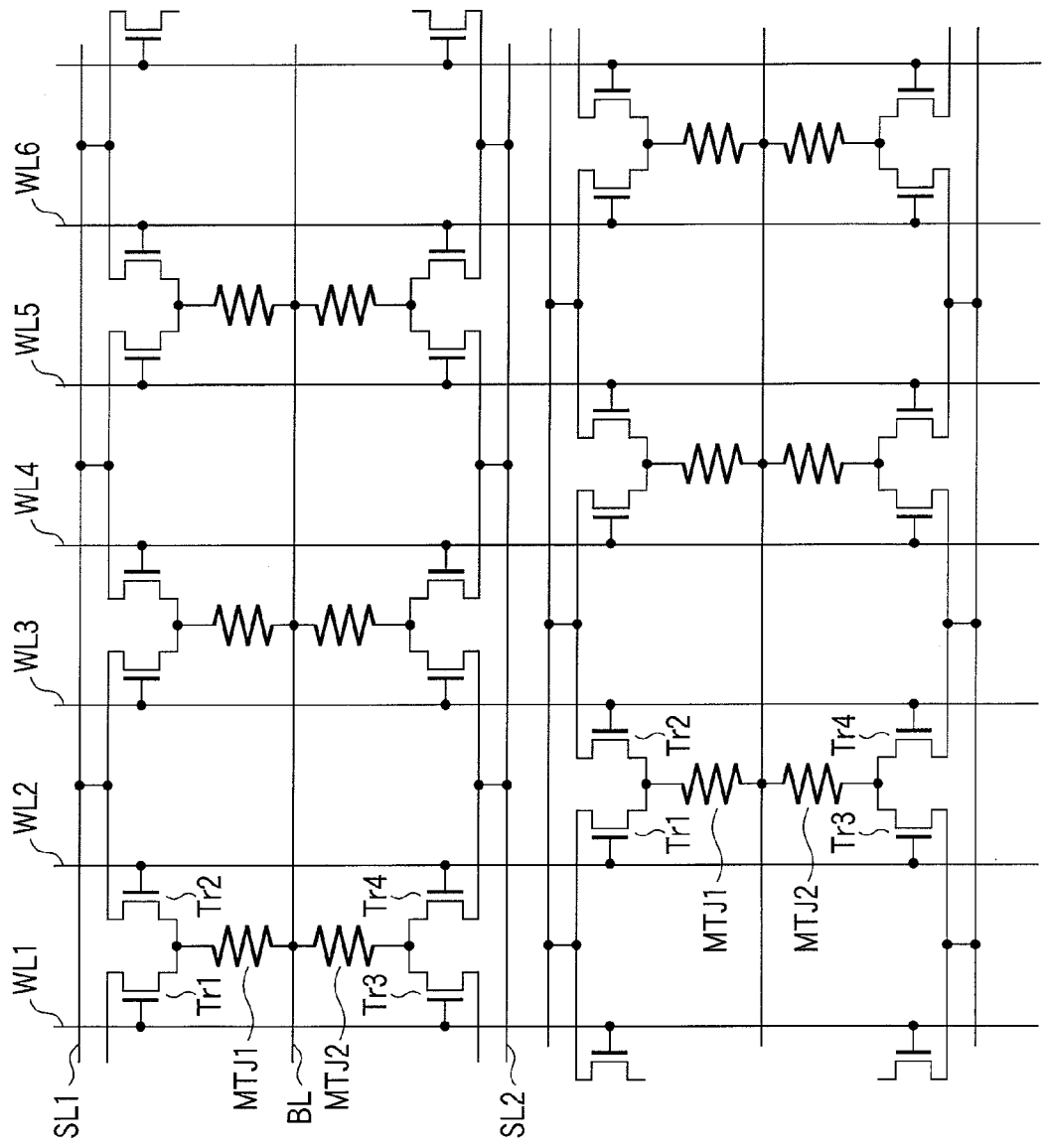
FIG. 12 is an equivalent circuit diagram showing a memory cell array of a third embodiment.

FIG. 12 is an equivalent circuit diagram showing a memory cell array of a semiconductor memory device of a third embodiment.

Figure 13:
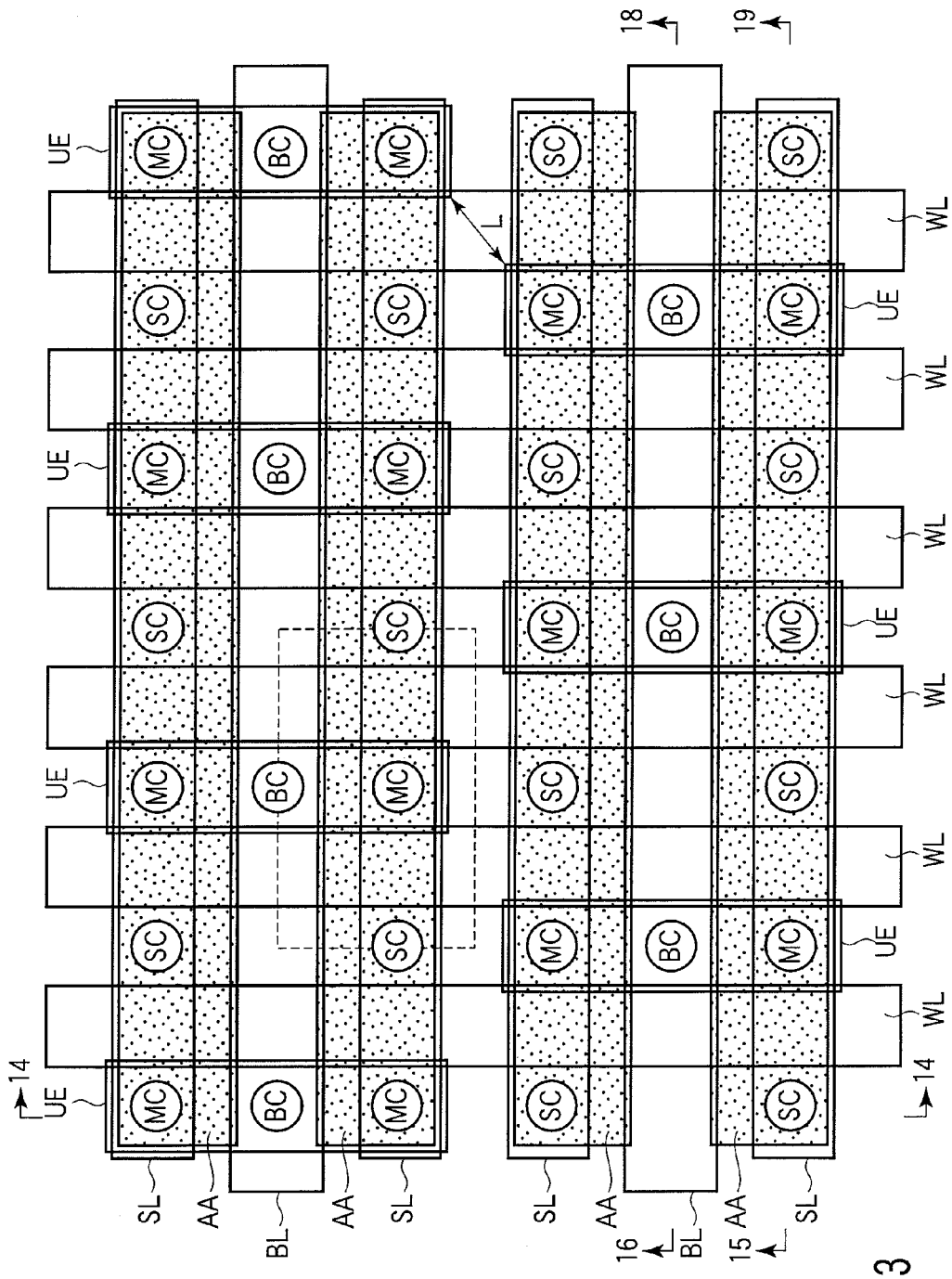
FIG. 13 is a plan view of the memory cell array of a semiconductor memory device of the third embodiment.
Figure 15:
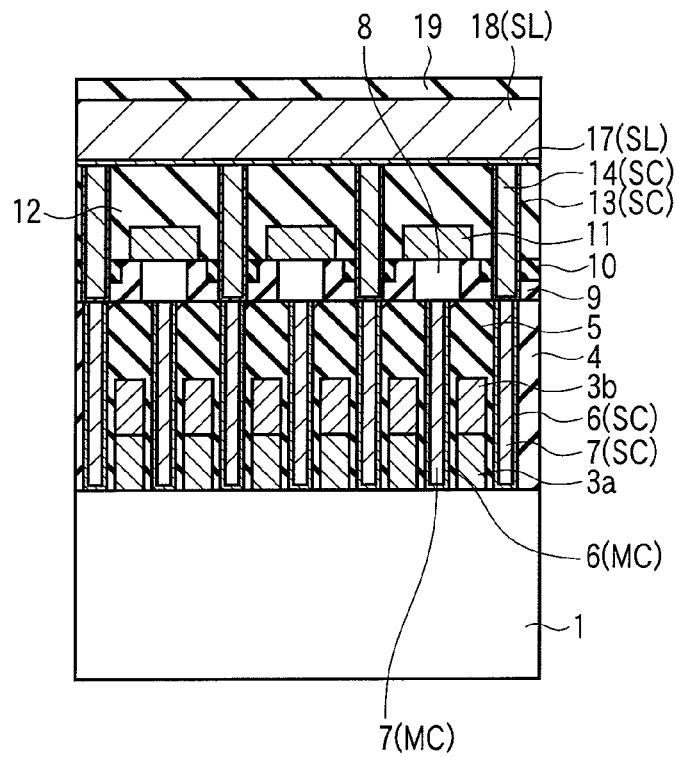
FIG. 15 is a sectional view along arrows 15-15 of the plan view of FIG. 13.
Figure 16:
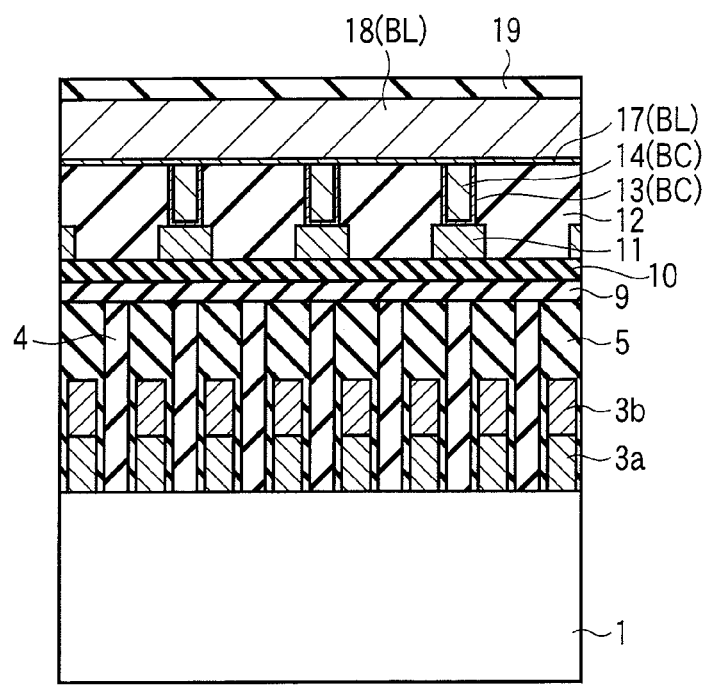
FIG. 16 is a sectional view along arrows 16-16 of the plan view of FIG. 13.
Figure 24:
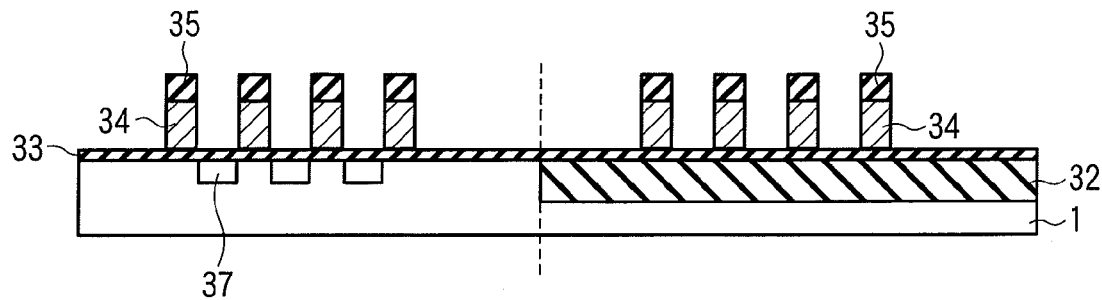
FIG. 24 is a sectional view for explaining the manufacturing method of the fourth embodiment subsequently to FIG. 22.
Figure 25:
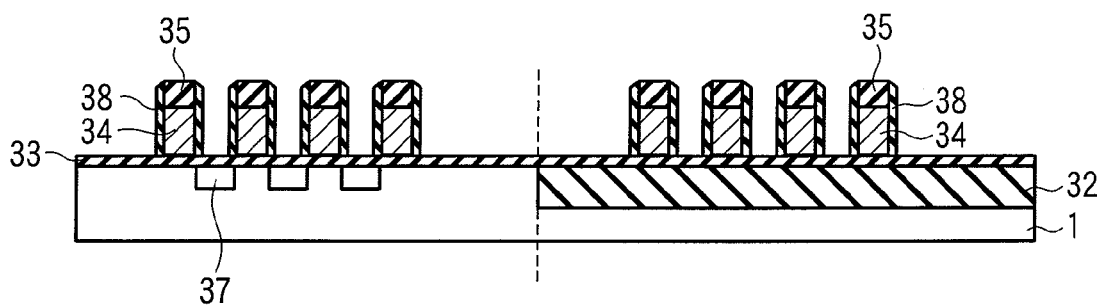
FIG. 25 is a sectional view for explaining the manufacturing method of the fourth embodiment subsequently to FIG. 24.
Figure 26:
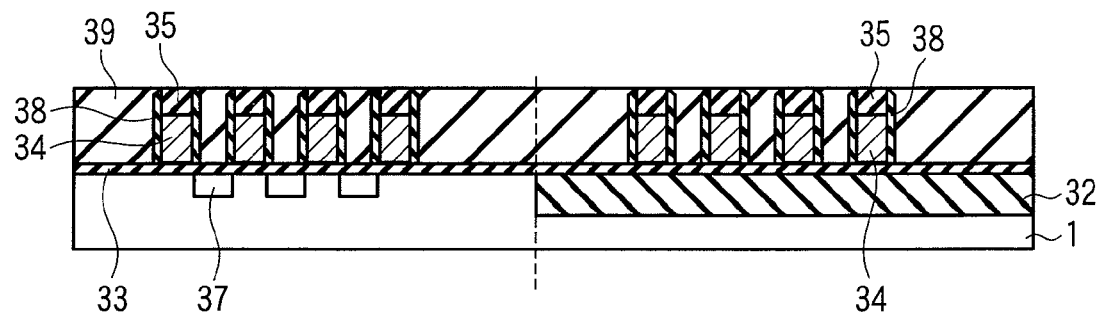
FIG. 26 is a sectional view for explaining the manufacturing method of the fourth embodiment subsequently to FIG. 25.
Figure 37:
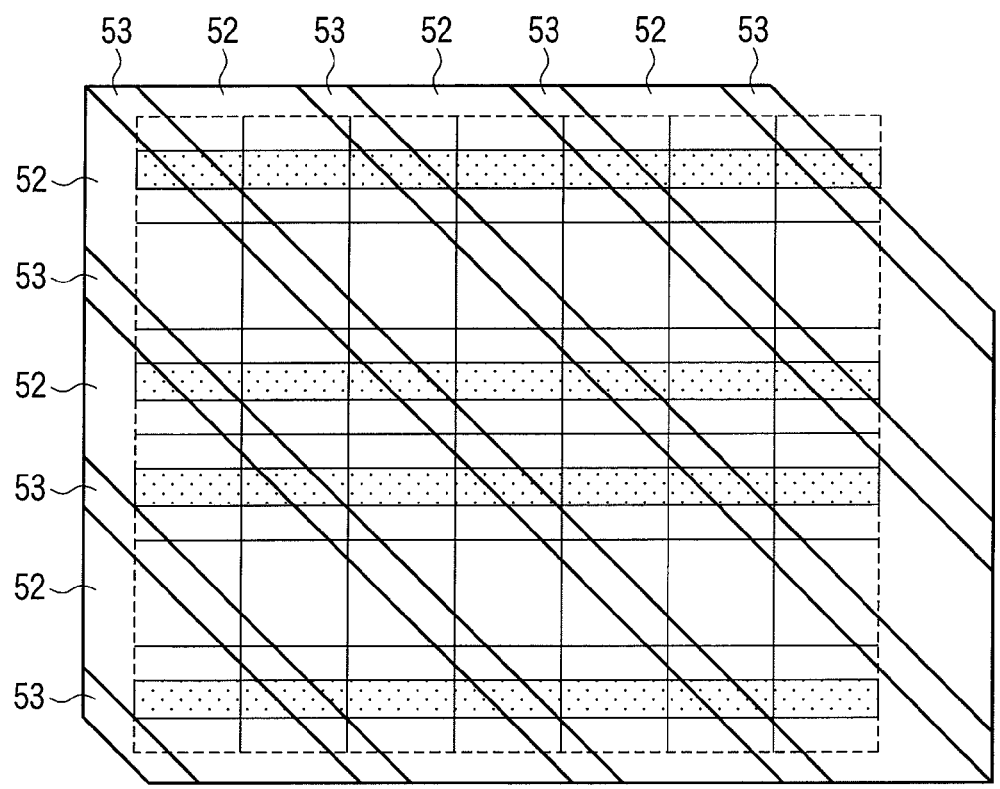
FIG. 37 is a plan view for explaining the other forming method of the MTJ element in the manufacturing method of the embodiment subsequently to FIG. 36.

FIG. 13 is a plan view showing the memory cell array of the semiconductor memory device of the third embodiment. FIG. 14 is a sectional view along arrows 14-14 of the plan view of FIG. 13, FIG. 15 is a sectional view along arrows 15-15 of FIG. 13, and FIG. 16 is a sectional view along arrows 16-16 of the plan view of FIG. 13. It is to be noted that parts corresponding to those of the diagrams described above are denoted with the same reference symbols as those of the diagrams, and detailed description thereof is omitted.

The present embodiment is different from the second embodiment in that as shown in FIG. 12, a cell unit (Tr1 to Tr4 and MTJ1 and MTJ2) disposed adjacent to another cell unit in a first direction (the arrangement direction of bit lines) shifts from the other cell unit in a second direction (the arrangement direction of word lines). As shown in FIG. 13, the shift amount of each cell unit is 2F for three columns. That is, the layout of the plurality of cell units has a checkered pattern.

According to the present embodiment, even when miniaturization advances, MTJ elements can easily be formed, thereby improving yield.

One of reasons is that a length L between contacts MC (upper electrodes) of the second embodiment is larger than that of the second embodiment as shown in FIG. 13.

Another reason is as follows. FIG. 17 shows the pattern layout of masks for forming contacts SC and BC of the present embodiment. The layout of the contacts SC and BC of the second embodiment is shown in FIG. 9.

When FIG. 17 is compared with FIG. 9, it is seen that the pattern layout of the contacts SC and BC of the present embodiment has a high pattern periodicity (the high symmetry of pattern arrangement) as compared with the pattern layout of the contacts SC and BC of the second embodiment. As shown in FIG. 17, in the present embodiment, a length between the centers of the adjacent contacts SC and BC is $2\sqrt{2} \times F$.

The high pattern periodicity (the high symmetry of the pattern arrangement) is advantageous in respect of the margin of lithography process. Therefore, according to the present embodiment, also when an exposure wavelength comes close to a length F, the MTJ elements can easily be formed, thereby improving the yield.

FIG. 18 to FIG. 38 are diagrams for explaining the manufacturing method of the memory cell array of the present embodiment.

[FIG. 18]

A mask (an AA mask) 30 which covers an active area is formed on a silicon substrate 1. In FIG. 18, the left side of a broken line corresponds to a sectional view of a cross section along the arrows 15-15 of FIG. 13, and the right side of the broken line corresponds to a sectional view of a cross section along the arrows 16-16 of FIG. 13 (this also applies to another sectional view including the broken line). The material of the AA mask 30 is, for example, photoresist or silicon nitride.

FIG. 19 shows the pattern layout of the AA masks. The AA masks have a (rectangular) pattern corresponding to the active area.

[FIG. 20]

The silicon substrate 1 is etched by reactive ion etching (RIE) process using the AA mask 30, to form isolation 31 on the surface of the silicon substrate 1. Afterward, the AA mask 30 is removed. When the material of the AA mask 30 is photoresist, the AA mask 30 is removed by, for example, asking. When the AA mask 30 is made of silicon nitride, the AA mask 30 is removed by, for example, wet etching.

[FIG. 21]

An insulating film such as a silicon oxide film is deposited by CVD process, and then the surface of the film is planarized by CMP process, to fill the isolation 31 with an isolation insulating film 32.

[FIG. 22]

A gate insulating film 33 is formed on the substrate (the silicon substrate 1 on which the isolation insulating film 32 has been formed). The gate insulating film 33 is, for example, a silicon oxide film or a hafnium oxide film. A conductive film for constituting gate electrodes 34 is formed on the gate insulating film 33, and then an insulating film for constituting cap insulating films 35 which cover the upper surfaces of the gate electrodes 34 is formed on the conductive film.

The above conductive film is, for example, a polycrystalline silicon film. The polycrystalline silicon film is formed by, for example, CVD process. The above insulating film is, for example, a silicon nitride film. The silicon nitride film is formed by, for example, CVD process.

Photolithography process and etching process are used to subject the conductive film and the insulating film to gate processing, thereby forming the gate electrodes 34 and the cap insulating films 35. FIG. 23 shows the pattern layout of masks (GC masks) 36 used in the photolithography process. FIG. 23 also shows the AA masks 30 to indicate a positional relation between the GC masks 36 and the AA masks 30.

[FIG. 24]

The cap insulating films 35 are used as masks to implant ions into the surface of the silicon substrate 1 by ion implantation process, and then annealing is performed to form source/drain regions 37 (an impurity diffusion layer) in the surface of the silicon substrate 1. When n-type source/drain regions 37 are formed, the above ions are, for example, phosphor or arsenic.

[FIG. 25]

Spacers 38 are formed on the side walls of the gate electrodes 34 and the cap insulating films 35. To form the spacers 38, an insulating film (e.g., a silicon nitride film) is deposited by CVD process, followed by etch back the insulating film by RIE process. The spacers 38 are disposed to obtain electric insulation between the gate electrodes 34 and contacts (barrier metal films and plugs) described later.

[FIG. 26]

An interlayer insulating film 39 is deposited by CVD process, and then the surface of the film is planarized by CMP process. The interlayer insulating film 39 is, for example, a silicon oxide film.

[FIG. 27]

Photolithography process and etching process are used to form through holes 40 in the interlayer insulating film 39. The through holes 40 are formed to constitute the contacts MC and SC.

FIG. 28 shows the pattern layout of masks (MC/SC masks) 41 used in the photolithography process. FIG. 28 also shows the insulating films 35 and 38 to indicate a positional relation between the MC/SC masks 41 and the insulating films 35 and 38 (the spacers, the cap insulating films). The photoresist pattern formed by using the insulating films 35, 38 and the MC/SC masks 41 is used as a mask during the etching process.

[FIG. 29]

Damascene process is used to form the barrier metal films and the plugs in the through holes 40, thereby forming the contacts MC and SC.

[FIG. 30]

A multilayer film (the fixed layer, the tunnel barrier layer and the recording layer) 8 for constituting the MTJ elements is formed by sputtering process.

[FIG. 31]

Photolithography process and the etching process are used to process the multilayer film 8 into a matrix pattern. FIG. 31 shows the pattern layout of the processed multilayer film 8 comprising 42 columns arranged in a matrix and having a center space of F. The etching process is, for example, RIE process.

[FIG. 32]

By etching process using a first mask 42, first portions 8A which are not necessary for the MTJ elements are removed from the multilayer film 8. The etching process is, for example, RIE process. The first mask 42 is made of, for example, tantalum (Ta) or titanium nitride (TiN). The first mask 42 has a pattern layout which can easily formed by a well-known mask process.

[FIG. 33]

By etching process using a second mask 43, second portions 8B which are not necessary for the MTJ elements are removed from the multilayer film 8. The etching process is, for example, RIE process. The second mask 43 is made of, for example, tantalum (Ta) or titanium nitride (TiN). The second mask 43 has a pattern layout which can easily formed by the well-known mask process.

FIG. 34 shows the pattern layout of the MTJ elements 8 obtained by such a process. FIG. 34 also shows active areas AA and gate portions G to indicate a positional relation among the MTJ elements 8, the active areas AA and the gate portions G (the gate electrodes, the spacers and the cap insulating films).

Here, the etching process is used to process the multilayer film 8, but ion milling process may be used instead.

Another method of forming the MTJ elements 8 will be described with reference to FIG. 35 to FIG. 39.

[FIG. 35]

Linear core materials 50 made of carbon extending in a horizontal direction are formed on the multilayer film 8, and spacers 51 made of silicon nitride are formed on the side walls of the core materials 50 by side wall leaving process. The multilayer film 8 is represented by a plurality of squares (the dimension of one side thereof is F). The width of each of the spacers 51 can be set to be smaller than a dimension determined by the limit of lithography process. The multilayer film 8 is sand-hatched. In this stage, the multilayer film 8 is not divided, but the multilayer film 8 is shown in the form of a plurality of divided rectangles. The rectangles are shown by broken lines. The dimension of one side of the rectangle is F.

[FIG. 36]

The core materials 50 are removed by ashing, and the multilayer film 8 is etched by using the spacers 51 as masks.

The multilayer film 8 left in this stage is sand-hatched. The width of the multilayer film 8 left in this stage is determined by the width of each of the spacers 51, and hence the width of the multilayer film 8 can be set to be smaller than the dimension determined by the limit of the lithography process. Afterward, the spacers 51 are removed by etching.

[FIG. 37]

Obliquely extending linear core materials 52 made of carbon are formed on the whole surface, and spacers 53 made of silicon nitride are formed on the side walls of the core materials 52 by the side wall leaving process. A multilayer film 8 between the adjacent core materials 52 is covered with the spacers 53. The width of each of the spacers 53 can be set to be smaller than the dimension determined by the limit of lithography process.

[FIG. 38]

The core materials 52 are removed by ashing, and the multilayer film 8 is etched by using the spacers 53 as masks. In consequence, MTJ elements formed of the multilayer films 8 having planar shape of rhombus are obtained. The multilayer films 8 can be processed by using the minute spacers 51 and 53 as the masks, whereby it is possible to form the minute MTJ elements with a satisfactory controllability.

Afterward, an insulating film 9, an interlayer insulating film 10, an upper electrode 11, an interlayer insulating film 12, a barrier metal film 13, a plug 14, interlayer insulating films 15 and 16, a barrier metal film 17, insulating films 18 and 19 and the like are formed by a well-known process as shown in FIG. 15 and FIG. 16.

Fourth Embodiment

The present embodiment is different from the second and third embodiments in that the center of a magnetic tunnel element 8 shifts from the center of a plug 7. It is to be noted that FIG. 39 is a sectional view corresponding to FIG. 4 along the 4-4 direction or FIG. 15 along the 15-15 direction, and each MTJ element 8 shifts in the 4-4 direction or the 15-15 direction which is a first direction (the longitudinal direction of a source line). A shift amount between the center of the plug 7 and the center of the MTJ element 8 is F/2 or more and less than F. When the shift amount is F or more, a short between the MTJ element 8 and the contact 14 might unfavorably occur. This contact 14 is disposed adjacent to the MTJ element 8 in the longitudinal direction of the source line SL.

The plug 7 is formed by damascene process. Therefore, a seam 20 might be generated in the center of the plug 7. In particular, when the plug 7 is formed in a hole having an aspect ratio of 5 or more by CVD process, the seam 20 is easily generated. The material of the plug 7 is, for example, tungsten.

When the seam in the plug 7 overlaps with the MTJ element 8, a contact defect occurs between the MTJ element 8 and the plug 7.

In view of the above fact, in the present embodiment, the center of the MTJ element 8 shifts from the center of the plug 7 in the first direction so as to decrease or eliminate the overlapping of the seam in the plug 7 with the MTJ element 8. This can effectively suppress the occurrence of the contact defect between the MTJ element 8 and the plug 7 (characteristic deterioration). Moreover, when the seam in the plug 7 less overlaps with the MTJ element 8, the flatness of an underlying layer of the MTJ element 8 is improved. The plug 7 is to be formed in underlying layer. In consequence, the process of MTJ element 8 is smoothly performed, and the deterioration of the magnetic characteristics of the MTJ element 8 (the characteristic deterioration) can effectively be suppressed.

It is to be noted that the structure of FIG. 39 is realized by, for example, a process of shifting the forming position of the MTJ element 8, and the forming position of the plug 7 is not changed. In this case, since the forming position of the MTJ element 8 is shifted, the forming positions of an upper electrode UE and contacts BC (13 and 14) are also similarly shifted.

Moreover, FIG. 39 shows the structure in which the center of the MTJ element 8 completely shifts from the center of the seam 20 in the first direction (the longitudinal direction of the source line). However, the MTJ element 8 may not be completely shifted sometimes owing to a restriction on a dimension (design). Also in this case, the overlap amount between the plug 7 (seam 20) and the MTJ element 8 still decreases, and hence the above effect of the present embodiment can be obtained.

It is to be noted that the present invention is not limited to the above embodiments.

For example, the MTJ element has been described as the example of a variable resistive element in the above embodiments, but the other variable resistive elements described above may be used.

Moreover, in the above embodiments, the MOS transistor has been described as the example of a selection element, but another transistor such as a bipolar transistor or a diode or another semiconductor element other than the transistor may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first MOSFET and a second MOSFET arranged in a first direction and provided on a semiconductor substrate;
a first variable resistive element provided above the first and second MOSFETs, a lower end of the first variable resistive element being connected to drains of the first and second MOSFETs;
a third MOSFET and a fourth MOSFET arranged in the first direction and provided on the semiconductor substrate;
a second variable resistive element provided above the third and fourth MOSFETs, a lower end of the second variable resistive element being connected to drains of the third and fourth MOSFETs;
a first wiring line extending in the first direction and connected to sources of the first and second MOSFETs;
a second wiring line extending in the first direction and connected to sources of the third and fourth MOSFETs;
an upper electrode connecting an upper end of the first variable resistive element and an upper end of the second variable resistive element;
a third wiring line extending in the first direction and connected to the upper electrode,
wherein the first wiring line, the second wiring line, and the third wiring line are provided in a same layer.

2. The device according to claim 1, wherein the first variable resistive element and the second variable resistive element is arranged in a second direction perpendicular to the first direction.

3. The device according to claim 1, wherein the upper electrode is connected to the third wiring line via a plug.

4. The device according to claim 1, wherein the first MOSFET, the second MOSFET and the first variable resistive element constitute a first memory cell, the third MOSFET, the fourth MOSFET and the second variable resistive element constitute a second memory cell, the first and second memory cells constitute a cell unit, and a checkered pattern is formed by cell units, each of cell units is identical to the cell unit.

5. The device according to claim 1, further comprises a pattern layout of plugs, and wherein the pattern layout of the plugs includes a layout in which number of plugs most adjacent to one plug is four, and the four plugs are arranged at four vertex of a square when the one plug is positioned in a center of the square.

6. The device according to claim 1, wherein the first and second wiring lines are source lines, the third wiring line is a bit line, and the third wiring line is formed between the first wiring line and the second wiring line.

7. The device according to claim 1, wherein the variable resistive element is connected to the drain of the MOSFET via a plug, and a center of the variable resistive element is shifted from a center of the plug.

8. The device according to claim 1, wherein the variable resistive element has a planar shape of rhombus.

9. The device according to claim 1, wherein the first and second variable resistive elements are MTJ (magnetic tunnel junction) elements.

10. A semiconductor memory device comprising:
a first MOSFET and a second MOSFET arranged in a first direction and provided on a semiconductor substrate;
a first variable resistive element provided above the first and second MOSFETs, a lower end of the first variable resistive element being connected to drains of the first and second MOSFETs;
a third MOSFET and a fourth MOSFET arranged in the first direction and provided on the semiconductor substrate;
a second variable resistive element provided above the third and fourth MOSFETs, a lower end of the second variable resistive element being connected to drains of the third and fourth MOSFETs;
a first wiring line extending in the first direction and connected to sources of the first and second MOSFETs;
a second wiring line extending in the first direction and connected to sources of the third and fourth MOSFETs;
an upper electrode connecting an upper end of the first variable resistive element and an upper end of the second variable resistive element;
a third wiring line extending in the first direction and connected to the upper electrode,
wherein the first MOSFET, the second MOSFET and the first variable resistive element constitute a first memory cell, the third MOSFET, the fourth MOSFET and the second variable resistive element constitute a second memory cell, the first and second memory cells constitute a cell unit, and a checkered pattern is formed by cell units, each of cell units is identical to the cell unit, and
the device further comprises a pattern layout of plugs, the plugs including plugs for connecting sources of the first MOSFETs and the second MOSFETs of the cell units with the first wiring line, plugs for connecting sources of the third MOSFETs and the fourth MOSFETs of the cell units with the second wiring line, plugs for connecting the first variable resistive elements and the second variable resistive elements of the cell units with the upper electrode, and wherein the pattern layout of the plugs includes a layout in which number of plugs most adjacent to one plug is four, and the four plugs are arranged at four vertex of a square when the one plug is positioned in a center of the square.

11. A semiconductor memory device comprising:
a first MOSFET and a second MOSFET arranged in a first direction and provided on a semiconductor substrate;
a first variable resistive element provided above the first and second MOSFETs, a lower end of the first variable resistive element being connected to drains of the first and second MOSFETs;
a third MOSFET and a fourth MOSFET arranged in the first direction and provided on the semiconductor substrate;
a second variable resistive element provided above the third and fourth MOSFETs, a lower end of the second variable resistive element being connected to drains of the third and fourth MOSFETs;
a first wiring line extending in the first direction and connected to sources of the first and second MOSFETs;
a second wiring line extending in the first direction and connected to sources of the third and fourth MOSFETs;
an upper electrode connecting an upper end of the first variable resistive element and an upper end of the second variable resistive element;
a third wiring line extending in the first direction and connected to the upper electrode;
wherein the first and second wiring lines are source lines, the third wiring line is a bit line, and the third wiring line is formed between the first wiring line and the second wiring line.

* * * * *